(12) United States Patent
Jung et al.

(10) Patent No.: US 11,664,473 B2
(45) Date of Patent: May 30, 2023

(54) SPAD PIXEL STRUCTURE AND METHOD OF MANUFACTURING SAME

(71) Applicant: DB HiTek Co., Ltd., Bucheon-si (KR)

(72) Inventors: Ju Hwan Jung, Seoul (KR); Byoung Soo Choi, Suwon-si (KR); Man Lyun Ha, Mungyeong-si (KR)

(73) Assignee: DB HiTek, Co., Ltd., Bucheon-si (KR)

( * ) Notice: Subject to any disclaimer, the term of this patent is extended or adjusted under 35 U.S.C. 154(b) by 0 days.

(21) Appl. No.: 17/837,872

(22) Filed: Jun. 10, 2022

(65) Prior Publication Data

US 2022/0416109 A1 Dec. 29, 2022

(30) Foreign Application Priority Data

Jun. 29, 2021 (KR) .................. 10-2021-0084775

(51) Int. Cl.
*H01L 31/107* (2006.01)
*H01L 31/02* (2006.01)
*H01L 27/146* (2006.01)

(52) U.S. Cl.
CPC ........ *H01L 31/107* (2013.01); *H01L 27/1461* (2013.01); *H01L 27/1463* (2013.01); *H01L 27/14605* (2013.01); *H01L 31/02027* (2013.01)

(58) Field of Classification Search
CPC ............. H01L 31/107; H01L 27/14605; H01L 27/1461; H01L 27/1463; H01L 31/02027; H01L 27/14609; H01L 27/14636; H01L 27/14689
See application file for complete search history.

(56) References Cited

U.S. PATENT DOCUMENTS

| | | | |
|---|---|---|---|
| 7,008,815 B1 * | 3/2006 | Sze | ........................ H01L 21/266 438/320 |
| 9,728,667 B1 * | 8/2017 | Johnson | ............... H01L 27/1446 |
| 10,672,934 B2 | 6/2020 | Wang et al. | |
| 11,264,525 B2 | 3/2022 | Wang et al. | |
| 2019/0131478 A1 | 5/2019 | Wang et al. | |
| 2020/0279969 A1 | 9/2020 | Wang et al. | |
| 2022/0359780 A1 * | 11/2022 | Gäbler | ............ H01L 31/035272 |
| 2022/0416109 A1 * | 12/2022 | Jung | .................. H01L 27/14605 |
| 2023/0054279 A1 * | 2/2023 | Wang | .................... H04B 10/801 |

FOREIGN PATENT DOCUMENTS

KR 20190049598 A 5/2019

* cited by examiner

*Primary Examiner* — Tony Ko
(74) *Attorney, Agent, or Firm* — Andrew D. Fortney; Central California IP Group, P.C.

(57) ABSTRACT

Provided are a single-photon avalanche diode (SPAD) pixel structure and a method of manufacturing the same. More particularly, provided are a SPAD pixel structure and a method of manufacturing the same, including an additional PN junction in a vertical or horizontal direction to increase photon detection efficiency and thus improve the sensitivity in an imaging device.

18 Claims, 26 Drawing Sheets

SPAD PIXEL STRUCTURE AND METHOD OF MANUFACTURING SAME

CROSS REFERENCE TO RELATED APPLICATION

The present application claims priority to Korean Patent Application No. 10-2021-0084775, filed Jun. 29, 2021, the entire contents of which are incorporated herein for all purposes by this reference.

BACKGROUND OF THE INVENTION

Field of the Invention

The present disclosure relates to a single-photon avalanche diode (SPAD) pixel structure and a method of manufacturing the same. More particularly, the present disclosure relates to a SPAD pixel structure and a method of manufacturing the same, including an additional PN junction in a vertical or horizontal direction to increase photon detection efficiency and thus improve the sensitivity in an imaging device.

Description of the Related Art

In general, single-photon avalanche diodes, which are referred to as SPADs, are used as pixel photoelectric conversion devices of an imaging device. The SPADs have PN junctions to detect incident radiation, and operate in Geiger mode (that is, a mode operating with a voltage much higher than a breakdown voltage, which is also referred to as an avalanche voltage, of the single-photon avalanche diode). Since a voltage exceeding the breakdown voltage is applied to a SPAD, an electron avalanche occurs due to carriers generated by photoelectric conversion, and the SPAD enters a breakdown state. As a result, carrier amplification caused by photoelectric conversion occurs, and the sensitivity in an imaging device may be improved.

FIG. 1 is a plan view of a conventional SPAD pixel structure. FIG. 2 is a cross-sectional view of the pixel structure of FIG. 1, taken along line a-a'. FIG. 3 is a graph showing absorption coefficients in silicon over a wavelength range.

Hereinafter, a conventional SPAD pixel structure and its problems will be described with reference to the accompanying drawings.

Referring to FIGS. 1 and 2, in a conventional SPAD pixel structure 9, inside a bulk region 910 having a first conductivity type, one impurity region 930 having a second conductivity type is formed at the surface of the bulk region 910. Accordingly, a relatively wide PN junction 950 may be formed in the horizontal direction, but it does not expand significantly in the vertical direction. In addition, a time-of-flight (ToF) sensor mainly uses a near-infrared (NIR) region with a long wavelength of 900 nm. The light in the NIR region has a low absorption coefficient in the bulk region 910, and reaches the depths of the bulk region 910 without absorption (see FIG. 3). Herein, in the conventional structure 9, the PN junction 950 is formed in a structure in which the region does not expand significantly in the vertical direction, so it is difficult to improve the sensitivity in the imaging device.

To solve the above problem(s), the present disclosure concerns a new SPAD pixel structure and a method of manufacturing the same having an improved structure.

The foregoing is intended merely to aid in the understanding of the background of the present disclosure, and is not intended to mean that the present disclosure falls within the purview of the related art or subject matter that is already known to those skilled in the art.

RELATED ART

Korean Patent Application Publication No. 10-2019-0049598, entitled "SPAD IMAGE SENSOR AND ASSOCIATED FABRICATING METHOD"

SUMMARY OF THE INVENTION

The present disclosure is directed to a solution for the problem(s) in the related art described above.

The present disclosure is directed to a SPAD pixel structure and a method of manufacturing the same, including an additional PN junction in a vertical or horizontal direction in an existing SPAD pixel structure so as to increase photon detection efficiency and thus improve the sensitivity in an imaging device.

In addition, the present disclosure is directed to a SPAD pixel structure and a method of manufacturing the same that minimizes the process to form the additional PN junction so as to improve manufacturing efficiency.

In addition, the present disclosure is directed to a SPAD pixel structure and a method of manufacturing the same including a plurality of pillar regions extending in a vertical direction and spaced apart in a horizontal direction so as to minimize a decrease in the horizontal area of a corresponding PN junction.

The present disclosure may be implemented by one or more embodiments having one or more of the following configurations, to achieve one or more of the above-described objectives.

According to one or more embodiments of the present disclosure, there is provided a SPAD pixel structure, including a bulk region having a first conductivity type; heavily doped impurity regions spaced apart in an vertical direction within the bulk region, the impurity regions having a second conductivity type; a lightly doped guard ring deeper than an uppermost one of the impurity regions, the guard ring surrounding the impurity regions and having the second conductivity type; a cathode on the uppermost one of the impurity regions; an anode at the bulk region, and multiple PN junctions between the bulk region and the impurity regions, spaced apart in the vertical direction.

According to one or more other embodiments of the present disclosure, the guard ring of the SPAD pixel structure may include a conductive region connecting the impurity regions.

According to one or more other embodiments of the present disclosure, the conductive region of the SPAD pixel structure may be only in a part of the guard ring, and may extend from the uppermost one of the impurity regions to a position that is in contact with a lowermost one of the impurity regions (e.g., in the bulk region).

According to one or more other embodiments of the present disclosure, there is provided a SPAD pixel structure, including a bulk region having a first conductivity type; heavily doped first impurity regions spaced apart in an vertical direction within a second impurity region, the first impurity regions having the first conductivity type, and the second impurity region having a second conductivity type and surrounding the first impurity regions; a cathode at a surface of the second impurity region; and an anode at a surface of an uppermost one of the first impurity regions, wherein the first impurity regions include a conductive region that connects the first impurity regions to each other and extends in the vertical direction within the second impurity region, and multiple PN junctions between the second impurity region and the first impurity regions are spaced apart in the vertical direction.

According to one or more other embodiments of the present disclosure, the first impurity regions of the SPAD pixel structure may be formed by ion implantation (e.g., using the same mask pattern).

According to one or more other embodiments of the present disclosure, each of the first impurity regions of the SPAD pixel structure may have a disk shape.

According to one or more other embodiments of the present disclosure, there is provided a SPAD pixel structure, including a bulk region having a first conductivity type, a front surface and a rear surface; a heavily doped impurity region at a surface of the bulk region and/or within the bulk region, the impurity region having a second conductivity type; a heavily doped pillar region connected to the impurity region and extending to a predetermined depth, the pillar region having the second conductivity type; a cathode on the impurity region; and an anode at the bulk region, wherein a PN junction between the pillar region and the bulk region is substantially vertical.

According to one or more other embodiments of the present disclosure, the pillar region of the SPAD pixel structure may have a substantially planar and/or ring shape.

According to one or more other embodiments of the present disclosure, the pillar region of the SPAD pixel structure may have a part extending downward from one side and/or a lower portion of the impurity region.

According to one or more other embodiments of the present disclosure, the SPAD pixel structure may further include a lightly doped guard ring having the second conductivity type, surrounding an outer circumferential surface of the impurity region, wherein the guard ring may have a lowermost surface above a lowermost surface of the pillar region.

According to one or more other embodiments of the present disclosure, the SPAD pixel structure may comprise a plurality of the pillar regions, each connected to the impurity region, and spaced apart in a horizontal direction (e.g., independent of each other).

According to one or more other embodiments of the present disclosure, the plurality of the pillar regions of the SPAD pixel structure may completely overlap with the impurity region (e.g., they may be formed by ion implantation with a mask pattern used to form the impurity region and an additional mask pattern that exposes only part of the impurity region).

According to one or more other embodiments of the present disclosure, the plurality of the pillar regions of the SPAD pixel structure may be on at least one particular horizontal axis with respect to a horizontal axis passing through a center of the impurity region, and the impurity region may have a two-dimensional a disk shape.

According to one or more other embodiments of the present disclosure, there is provided a SPAD pixel structure including a bulk region having a first conductivity type; a heavily doped first impurity region at a surface of a second impurity region and/or in the second impurity region, the first impurity region having the first conductivity type, and the second impurity region having a second conductivity type and surrounding the first impurity region; and a pillar region connected to the first impurity region and extending into the second impurity region.

According to one or more other embodiments of the present disclosure, the pillar region of the SPAD pixel structure may have a (two-dimensional) ring shape with a predetermined height.

According to one or more other embodiments of the present disclosure, the SPAD pixel structure may comprise a plurality of the pillar regions, spaced apart from each other in a horizontal direction, and connected to each other via the first impurity region.

According to one or more other embodiments of the present disclosure, the plurality of the pillar regions of the SPAD pixel structure may have lowermost surfaces at substantially the same height.

According to the above configurations, the present disclosure has the following effects.

According to the present disclosure, an additional PN junction is in a vertical or horizontal direction in an existing SPAD pixel structure, so that photon detection efficiency can be increased, and the sensitivity in an imaging device can thus be improved.

In addition, according to the present disclosure, a process added to form the PN junction is minimized, so that manufacturing efficiency can be improved.

In addition, according to the present disclosure, a plurality of pillar regions extending in a vertical direction are spaced apart in a horizontal direction, to minimize a decrease in the horizontal area of the PN junction.

It is noted that, although not explicitly described under this section, an advantageous effect and a tentative advantageous effect that are expected from technical features of the present disclosure are regarded as being described in the present disclosure.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
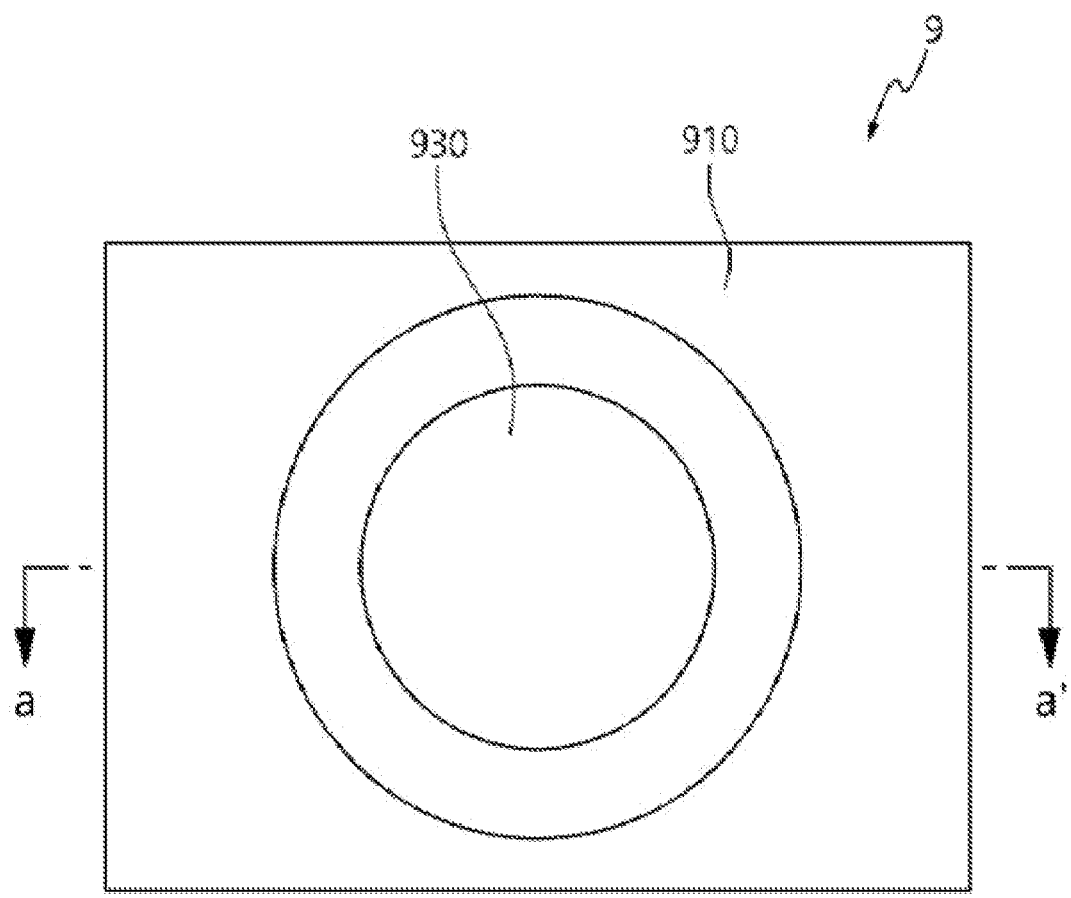
FIG. 1 is a plan view of a conventional SPAD pixel structure.

Hereinafter, embodiments of the present disclosure will be described in detail with reference to the accompanying drawings. It is noted that embodiments of the present disclosure may be changed to a variety of embodiments. The scope of the present disclosure should not be interpreted as being limited to the embodiments described hereinbelow, but should be interpreted on the basis of the descriptions in the appended claims. In addition, embodiments of the present disclosure are provided for reference in order to fully describe the disclosure for those skilled in the art.

Unless otherwise mentioned in context, a singular noun or a singular noun phrase may have a plural meaning throughout the present specification. The terms "comprise" and/or "comprising" that are used in the present specification are intended to indicate that a shape, a number, a step, an operation, a member, an element, and/or a group thereof that follow the term are present, and do not preclude the presence or addition of one or more other shapes, numbers, steps, operations, members, elements, and/or groups thereof.

It should be noted that, in a case where one element (layer) is described as being on another element (layer), this means that the one element may be directly on the top of the other element or that one or more third elements or layers may be therebetween. In addition, in the case where one element is described as being directly on the other element, no third element is therebetween. In addition, positioning on a "top", "upper portion", or "lower portion" of one element, positioning "above" or "below" one element, or positioning on "one lateral side" or a "lateral surface" of one element means a relative positional relationship.

In addition, the terms first, second, third, and so on may be used in order to describe various items, such as elements, regions, and/or portions, but do not impose any limitation to these items.

In addition, it should be noted that, where certain embodiments are otherwise feasible, certain process sequences may be performed other than those described below. For example, two processes described in succession may be performed substantially simultaneously or in the reverse order.

In addition, conductivity types or doped areas of elements may be defined as "p-type" or "n-type," according to the primary carrier characteristics, but this is only for convenience of description, and the technical idea of the present disclosure is not limited thereto. For example, hereinafter, "p-type" and "n-type" will be replaced with the more general terms "first conductivity type" and "second conductivity type". Herein, the first conductivity type may refer to p-type, and the second conductivity type may refer to n-type.

In addition, it is to be understood that "heavily doped," "lightly doped," "high-concentration" and "low-concentration" represent a doping concentration in an impurity region relative to doping concentrations of other impurity regions.

In the present specification, according to need, individual elements may be integral with each other, or independent of or separate from each other. It should be noted that no specific limitation to these formations is imposed.

Hereinafter, a SPAD pixel structure according to a first exemplary embodiment of the present disclosure will be described in detail with reference to the accompanying drawings.

The present disclosure relates to a single-photon avalanche diode (SPAD) pixel structure 1, and particularly, to a SPAD pixel structure 1 including an additional PN junction in a vertical or horizontal direction to increase photon detection efficiency and thus improve the sensitivity in an imaging device.

Figure 4:
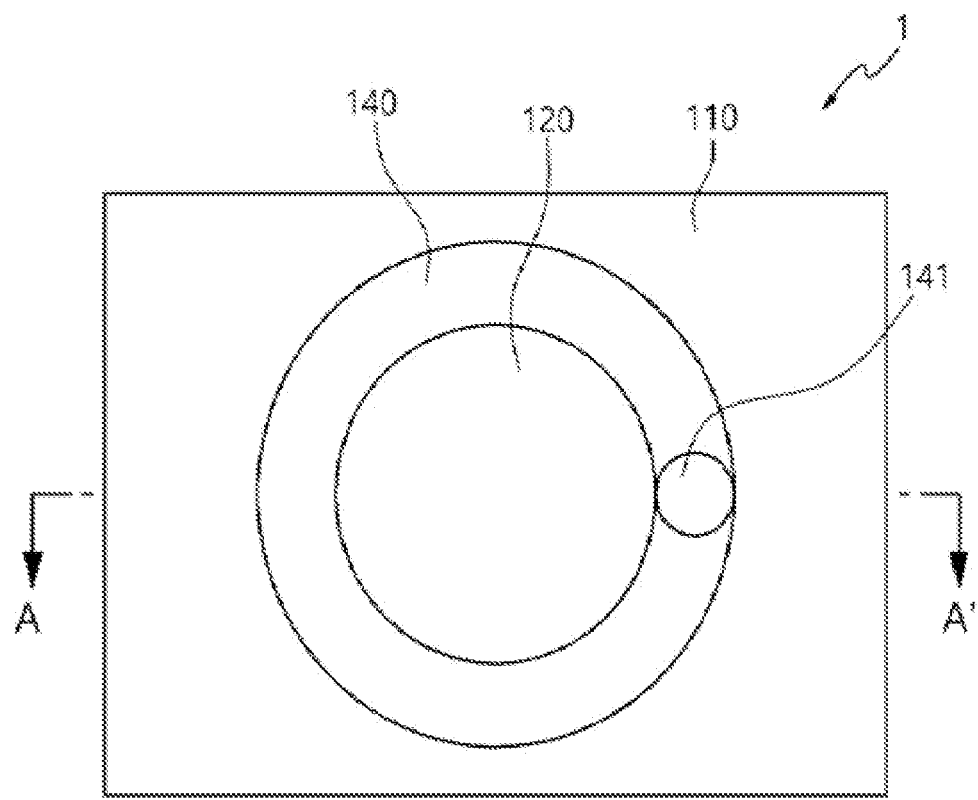
FIG. 4 is a plan view of a single-ended SPAD pixel structure according to a first exemplary embodiment of the present disclosure.
Figure 5:
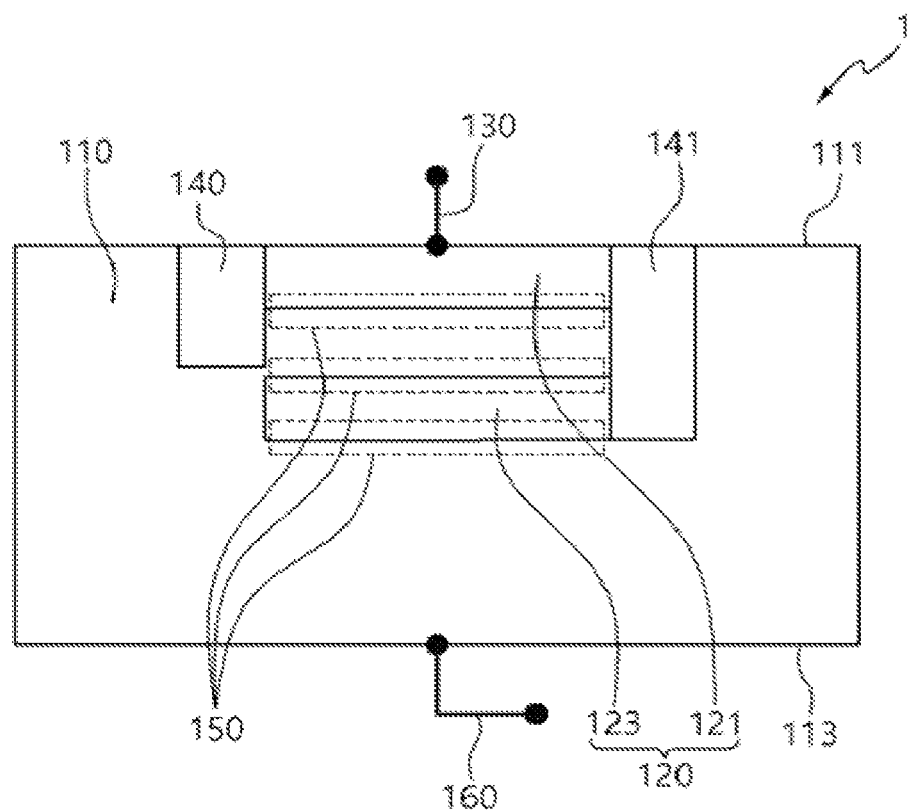
FIG. 5 is a cross-sectional view of the pixel structure of FIG. 4, taken along line A-A.

FIG. 4 is a plan view of a single-ended SPAD pixel structure according to the first exemplary embodiment of the present disclosure. FIG. 5 is a cross-sectional view of the pixel structure of FIG. 4, taken along line A-A'.

First, a single-ended SPAD structure 1 according to the first exemplary embodiment of the present disclosure will be described.

Referring to FIGS. 4 and 5, the single-ended SPAD pixel structure 1 according to the first exemplary embodiment includes a bulk region 110. The bulk region 110 may include a front surface 111 and a rear surface 113. An anode 160, which will be described later, may be at the front surface 111 or the rear surface 113. In addition, the bulk region 110 may be, for example, a lightly doped region having a first conductivity type. Inside the bulk region 110, two or more heavily doped impurity regions 120 having a second conductivity type are spaced apart in a vertical direction. For example, the impurity regions 120 may include a first impurity region 121 at the front surface 111 of the bulk region 110, and a second impurity region 123 below and spaced apart from the first impurity region 121. Alternatively, the impurity regions 120 may include three such impurity regions. No limitation thereto is imposed. The impurity regions 120 may be formed by ion implantation. The impurity regions 120 may have, for example, the shape of a disk, and may be surrounded by a guard ring 140, which will be described later.

A cathode 130 is on the uppermost impurity region (the first impurity region 121) of the impurity regions 120. The cathode 130 may be at any location in the first impurity region 121, for example, at approximately the center of the first impurity region 121.

The guard ring 140 is an impurity region having the second conductivity type with a lower concentration than the impurity regions 120. In general, photoelectric conversion in the SPAD pixel structure 1 occurs when a high voltage exceeding a breakdown voltage is applied. The guard ring 140 may prevent the occurrence of a breakdown state that might otherwise occur because an electric field generated by the high voltage is concentrated at the ends of the impurity regions 120, which is called edge breakdown. In addition, the guard ring 140 may have the shape of a ring, for example. In addition, it is preferable that the guard ring 140 (e.g., a lowermost surface thereof) is deeper from the surface 111 of the bulk region 110 than the uppermost region of the impurity regions 120 (e.g., a lowermost surface of the first impurity region 121), but no limitation thereto is imposed.

The guard ring 140 may include a conductive region 141. Since the plurality of impurity regions 120 overlap in the vertical direction, the plurality of impurity regions 120 may be connected to each other via the conductive region 141. The conductive region 141 is a part of the guard ring 140 that extends in the vertical direction. The extension length may vary according to the number of impurity regions 120, and the conductive region 141 may extend to a position that is in contact with the lowermost one of the impurity regions 120 (e.g., a lateral surface or portion of the lowermost impurity region 123) in the bulk region 110. In addition, the conductive region 141 may have the shape of a cylinder, for example. The conductive region 141 may be present in a particular region of the guard ring 140, in multiple regions of the lower portion of the SPAD, or only at one lateral side of the lower portion (e.g., of the SPAD). There is no limitation on the location of the conductive region 141, other than being in ohmic contact with each of the impurity regions 120.

In addition, a depletion region 150 may be formed for each PN junction at a boundary between the bulk region 110 and each of the impurity regions 120. With the above-described structure, a plurality of the depletion regions 150 overlap in a vertical direction, which is a feature of the present disclosure.

In general, when light from a subject is emitted or reflected, the light may reach the lower sides or surfaces of the impurity regions 120. Herein, carriers are generated by photoelectric conversion. In addition, as described above, a reverse bias voltage is applied to the SPAD. Specifically, a positively polarized voltage is applied to the cathode 130, and a negatively polarized voltage is applied to the anode 160. Accordingly, PN junctions at the interfaces between the bulk region 110 having the first conductivity type and the impurity regions 120 having the second conductivity type form the depletion regions 150. The voltage applied to the SPAD is applied equally to each of the depletion regions 150.

Figure 2:
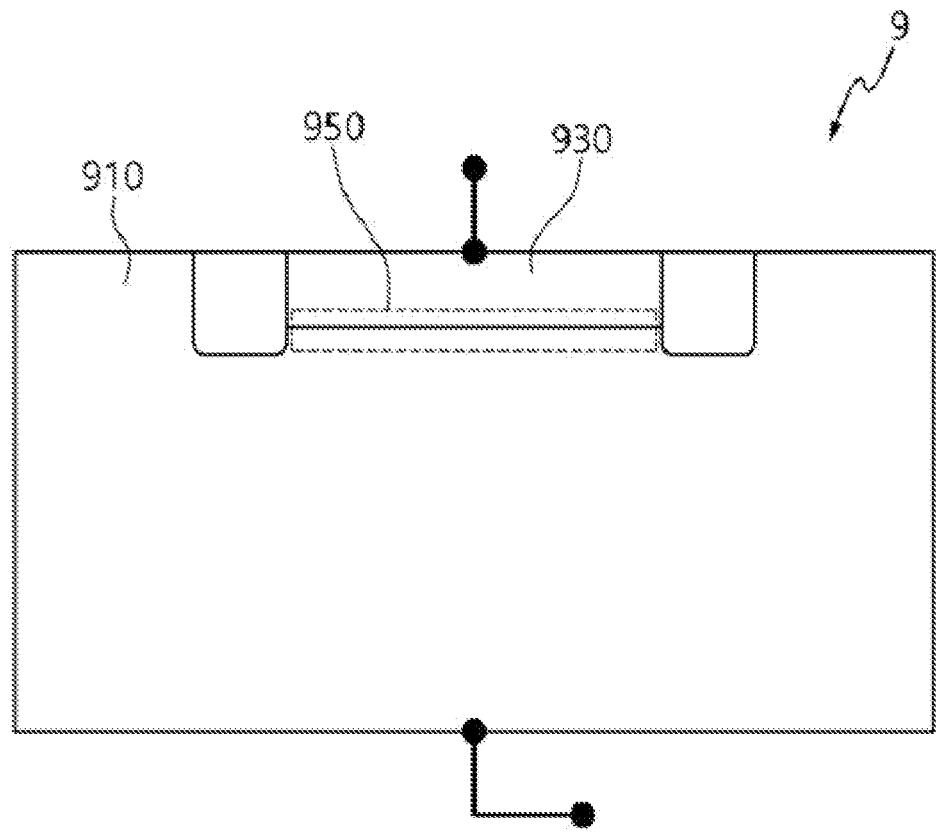
FIG. 2 is a cross-sectional view of the pixel structure of FIG. 1, taken along line a-a.
Figure 3:
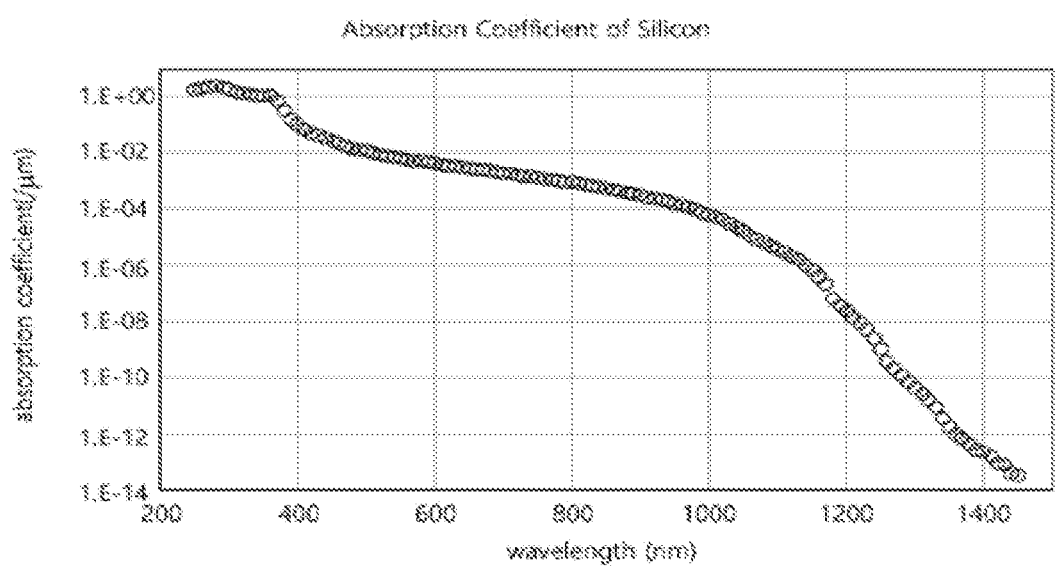
FIG. 3 is a graph showing absorption coefficients in silicon over a wavelength range.

Referring to FIGS. 1 and 2, in the conventional SPAD pixel structure 9, inside the bulk region 910 having the first conductivity type, one impurity region 930 having the second conductivity type is at the surface of the bulk region 910. Accordingly, the PN junction has a horizontal width corresponding to the pitch of the pixel, but does not expand significantly in the vertical direction. In addition, a time-of-flight (ToF) sensor mainly uses a near-infrared (NIR) region with a long wavelength of 900 nm. The light in the NIR region has a low absorption coefficient in the bulk region 910, and reaches the depths of the bulk region 910 without absorption. Herein, in the conventional structure 9, the PN junction is in a structure in which it does not expand significantly in the vertical direction, so it is difficult to improve the sensitivity of the pixel in an imaging device.

In order to prevent this problem, in the structure 1 according to one or more embodiments of the present disclosure, multiple depletion regions 150 are in the vertical direction (see FIG. 5). Accordingly, the limitations in the conventional structure 9 can be overcome.

Figure 6:
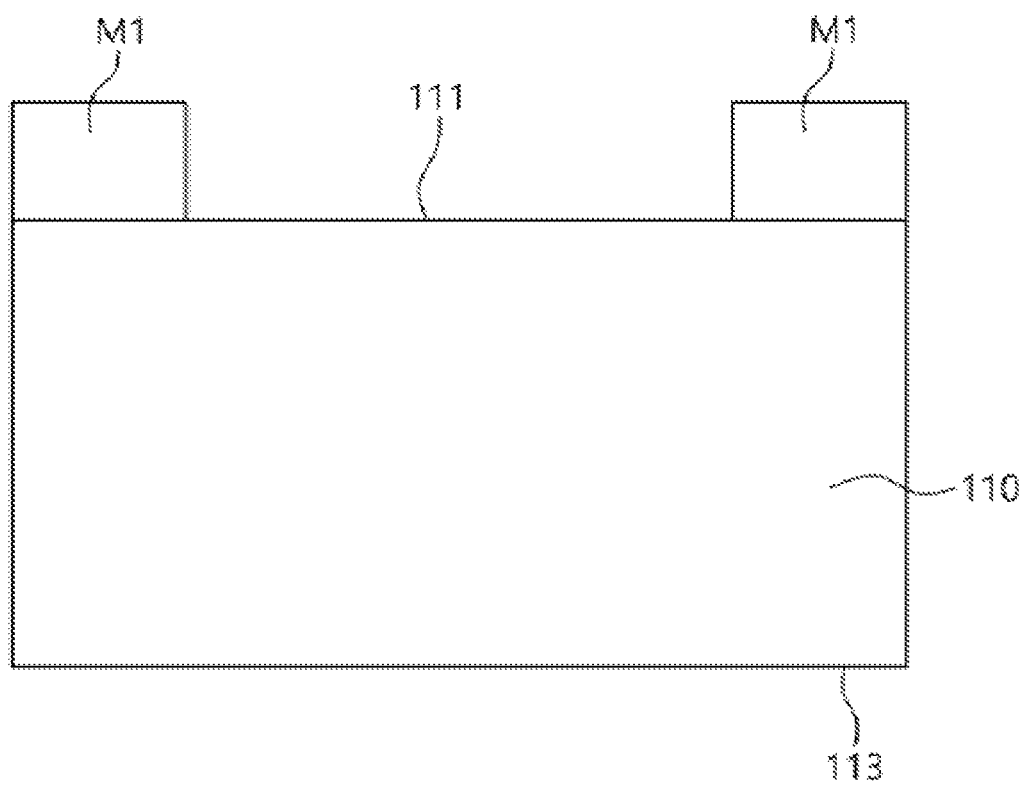
FIGS. 6 to 8 are cross-sectional views for reference for describing a method of manufacturing a single-ended SPAD pixel structure according to the first exemplary embodiment of the present disclosure.
Figure 7:
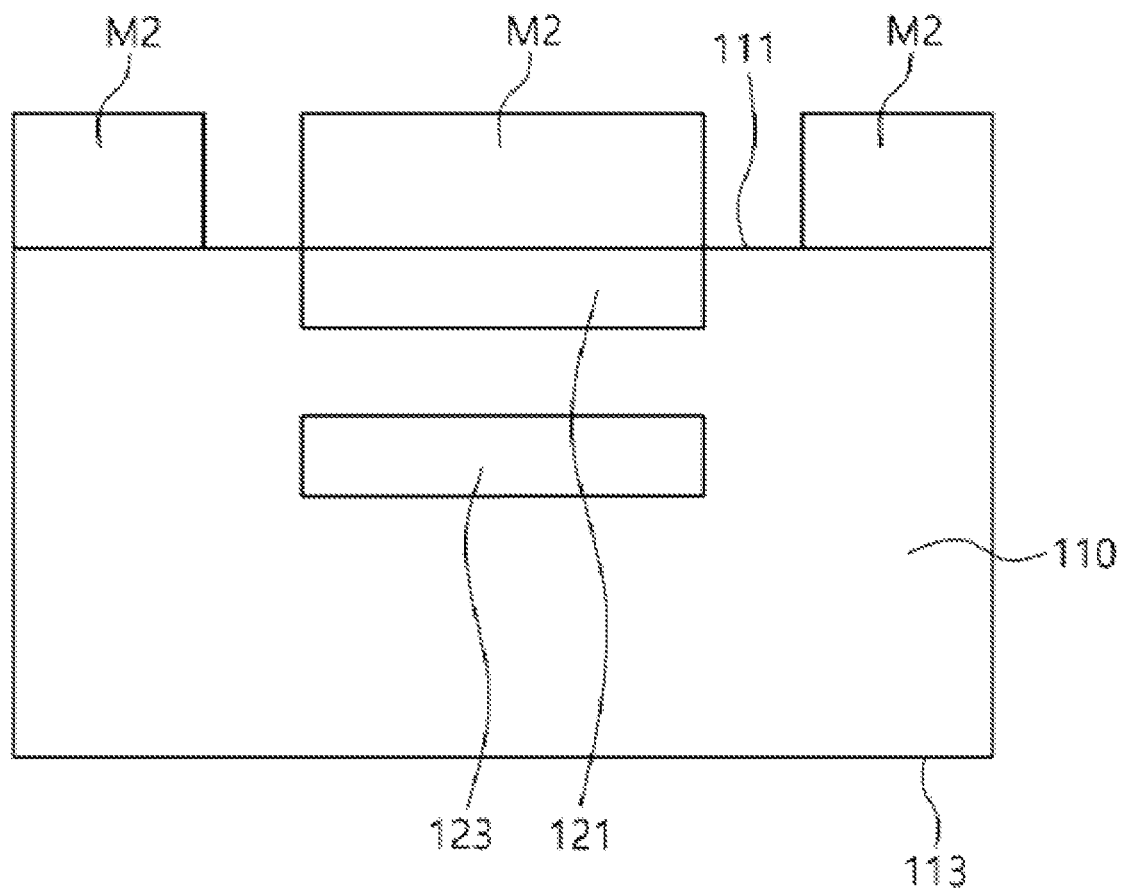
Figure 8:
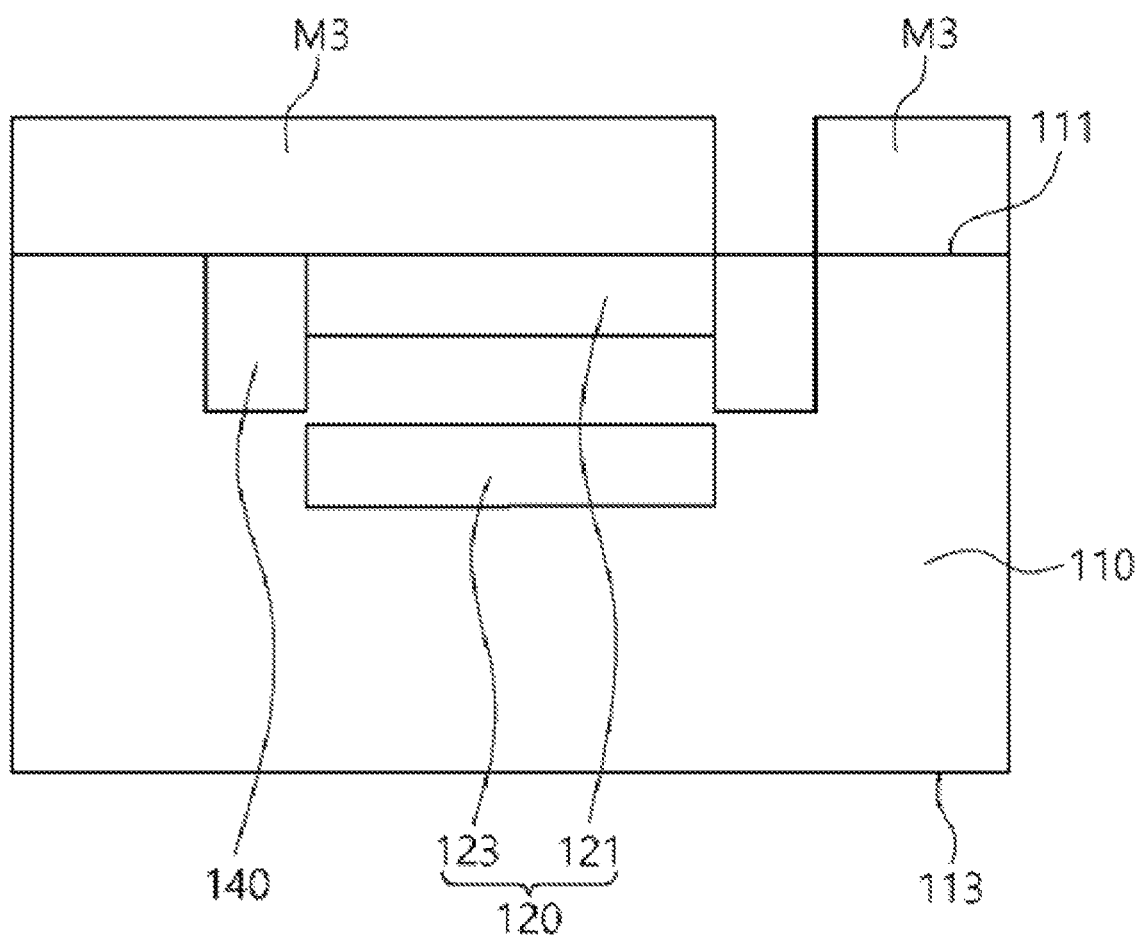

FIGS. 6 to 8 are cross-sectional views for reference for describing a method of manufacturing a single-ended SPAD pixel structure according to the first exemplary embodiment of the present disclosure.

Describing the method of manufacturing the single-ended SPAD structure according to the first exemplary embodiment, first, the plurality of impurity regions 120 are formed in the bulk region 110. Referring to FIG. 6, for example, a mask pattern M1 having an opening through which the impurity regions 120 are to be formed is formed on the surface of the bulk region 110. Afterward, an ion implantation process is performed. Herein, using the mask pattern M1, the ion implantation process is performed as many times as the number of spaced-apart impurity regions 120 to be formed in the vertical direction in the bulk region 110. The impurity regions 120 may be formed at different depths by adjusting the ion implantation energy. Accordingly, the expansion in the depletion regions 150 in the vertical direction is achieved using only the mask pattern M1, so an additional process is not required to form the additional impurity region(s) (e.g., impurity region 123).

Afterward, referring to FIGS. 7 and 8, the guard ring 140 is formed. For example, a mask pattern M2 having an opening through which the guard ring 140 is to be formed is formed on the surface of the bulk region 110, and an ion implantation process is performed. Afterward, referring to FIG. 8, a mask pattern M3 having an opening through which the conductive region 141 is to be formed is formed on the surface of the bulk region 110, and an ion implantation process is performed again. Therefore, the conductive region 141 as shown in FIGS. 4 and 5 may be formed. Next, the cathode 130 and the anode 160 are formed.

Figure 9:
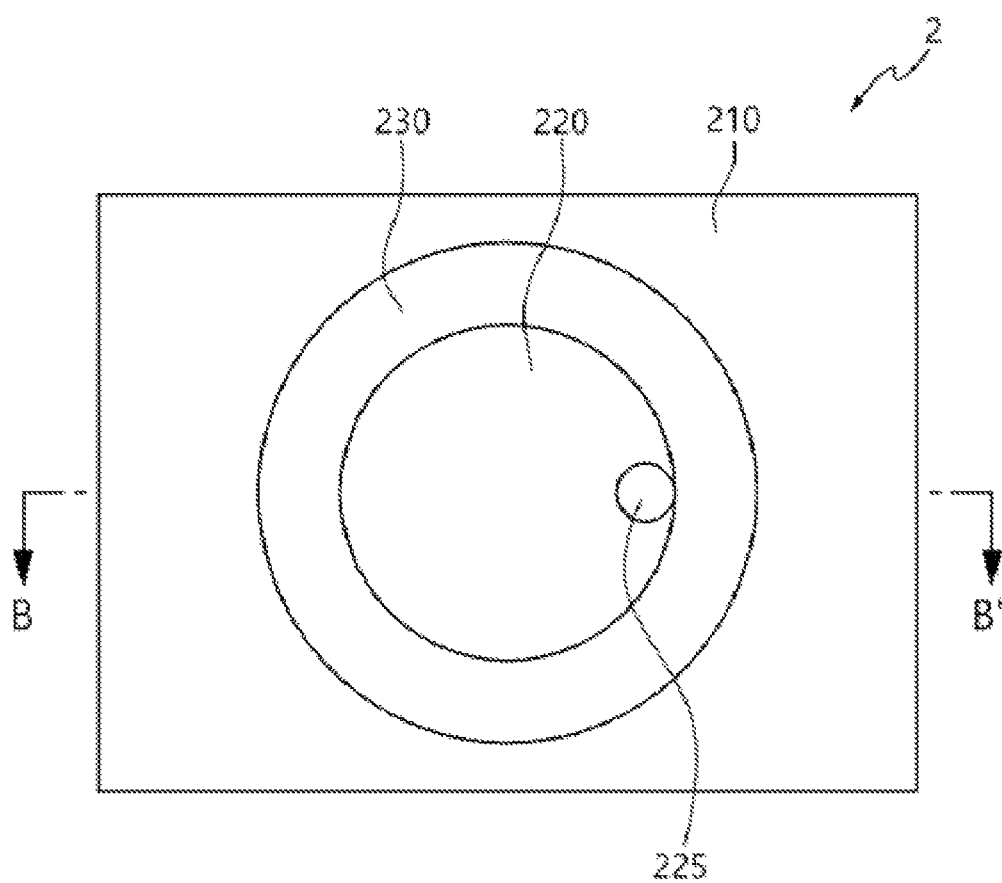
FIG. 9 is a plan view of a two-ended SPAD pixel structure according to a second exemplary embodiment of the present disclosure.
Figure 10:
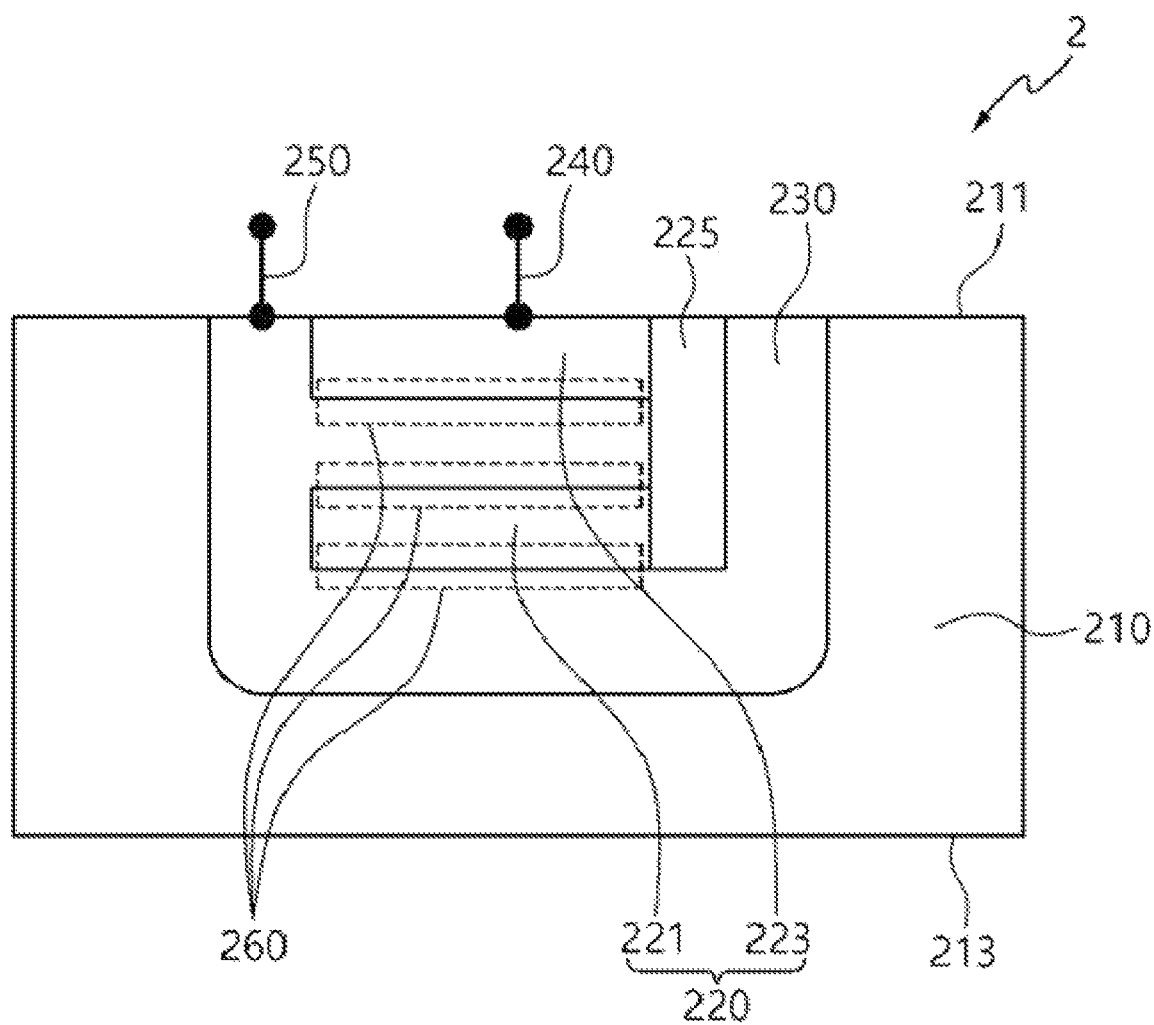
FIG. 10 is a cross-sectional view of the pixel structure of FIG. 9, taken along line B-B.

FIG. 9 is a plan view of a two-ended SPAD pixel structure according to a second exemplary embodiment of the present disclosure. FIG. 10 is a cross-sectional view of the pixel structure of FIG. 9, taken along line B-B'.

Hereinafter, a two-ended SPAD 2 according to the second exemplary embodiment of the present disclosure will be described.

Referring to FIGS. 9 and 10, a bulk region 210 having a first conductivity type includes a front surface 211 and a rear surface 213. The bulk region 210 contains high-concentration first impurity regions 220 having the first conductivity type, for example. The first impurity regions 220 may have a planar and/or disk shape, for example. In addition, a second impurity region 230 may be in the bulk region 210, surrounding the first impurity regions 220. That is, the second impurity region 230 surrounds the first impurity regions 220. The second impurity region 230 may have a high concentration of second conductivity type impurities, for example.

The first impurity regions 220 may have a multi-layer structure in a vertical direction within the second impurity region 230. That is, an upper impurity region 221 may be at the front surface 211 and in the bulk region 210, and a lower impurity region 223 may be below and spaced apart from the upper impurity region 221. As described above, two or three first impurity regions 220 may overlap in the vertical direction, but no limitation thereto is imposed.

In addition, the first impurity regions 220 may further include a conductive region 225. Since the plurality of first impurity regions 221 and 223 overlap in the vertical direction, the regions 221 and 223 may be connected to each other via the conductive region 225. The conductive region 225 is heavily doped with first conductivity type impurities, and may have substantially the same doping concentration as the first impurity regions 221 and 223. The conductive region 225 extends in the vertical direction, and may have a cylindrical shape, for example. In addition, the extension length of the conductive region 225 may vary according to the number of first impurity regions 220. The conductive region 225 extends to a position that is in contact with the lowermost one (e.g., a lateral portion, surface or side) of the first impurity regions 220.

In addition, it is preferable that the conductive region 225 is at one lateral end, portion or side of the first impurity regions 220 so as to easily form depletion regions 260, which will be described later. In addition, it is preferable that the conductive region 225 partially overlaps with the first impurity regions 220. That is, the conductive region 225 may not be along the entire outer circumferential surfaces of the first impurity regions 221 and 223.

In addition, the uppermost impurity region 221 may be connected to an anode 240, and the anode 240 may be approximately at the center of the uppermost impurity region 221. In addition, a cathode 250 may be connected to the second impurity region 230 (e.g., at a location on the surface thereof).

Through such a structure, multiple depletion regions 260 may overlap in the vertical direction in the second impurity region 230. Therefore, an effect similar to the single-ended SPAD described above may be achieved, and a detailed description thereof will be omitted.

Figure 11:
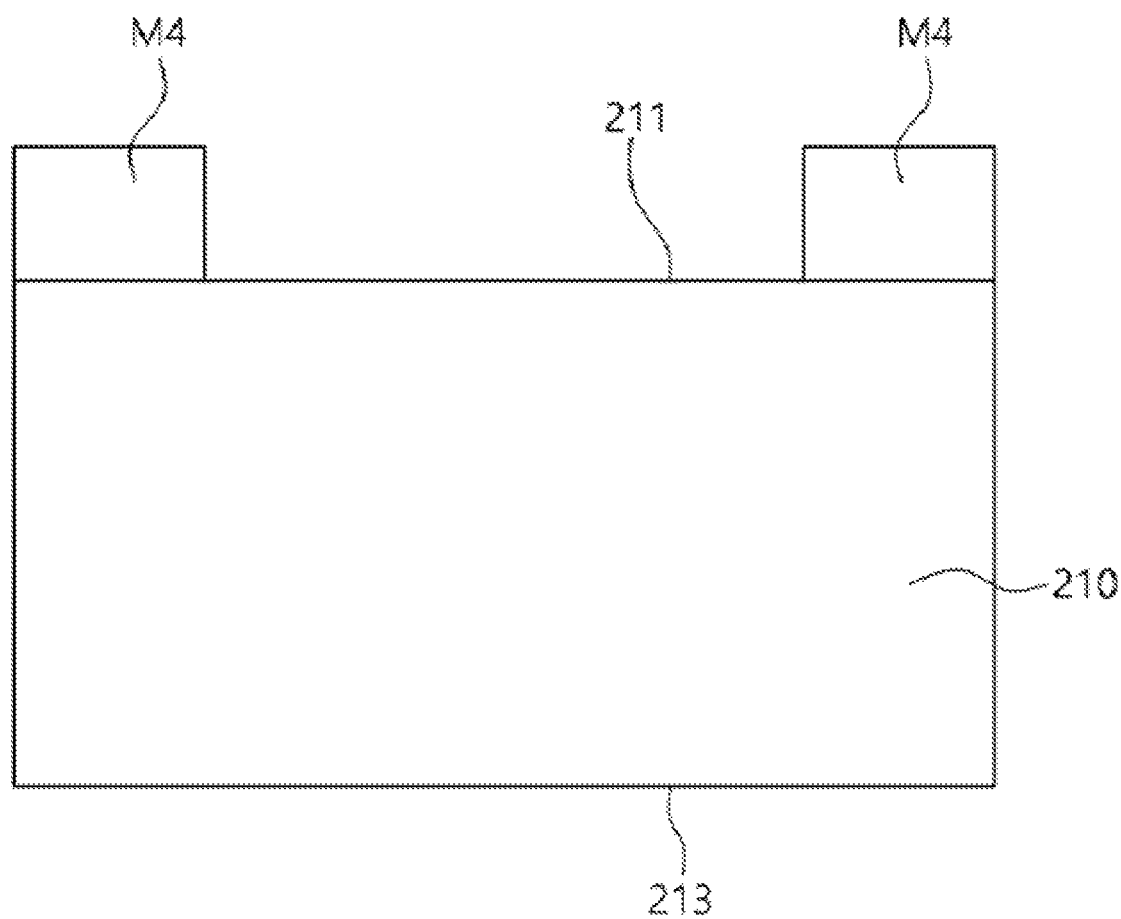
FIGS. 11 to 13 are cross-sectional views for reference for describing a method of manufacturing a two-ended SPAD pixel structure according to the second exemplary embodiment of the present disclosure.
Figure 12:
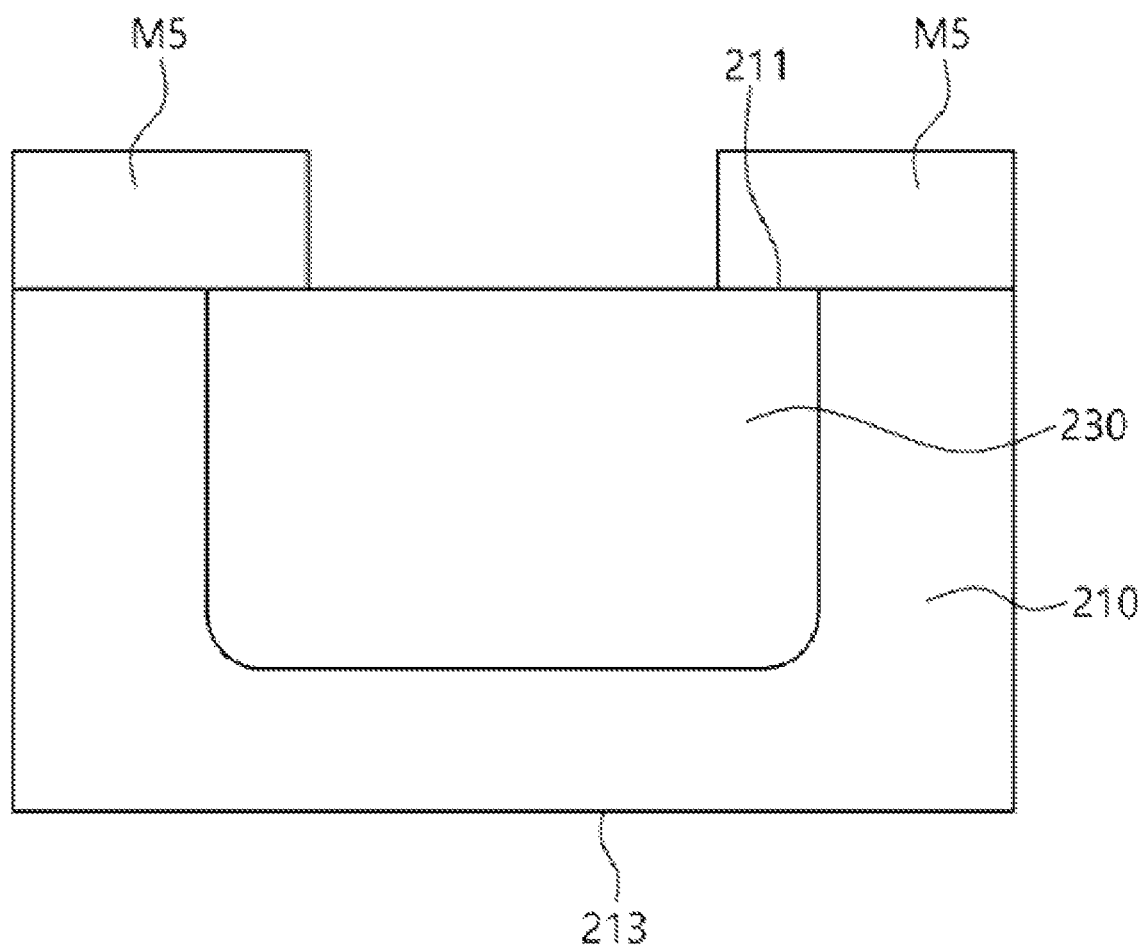
Figure 13:
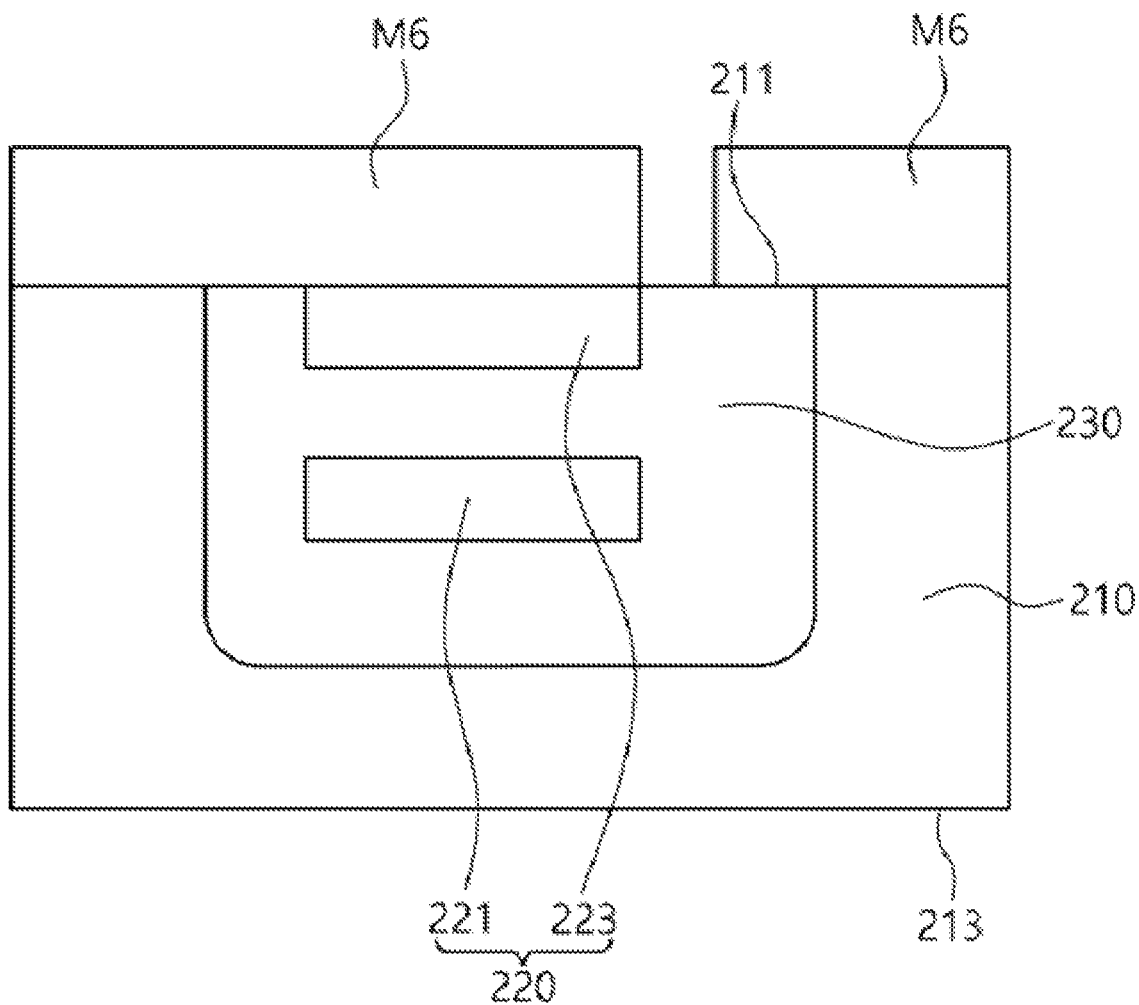

FIGS. 11 to 13 are cross-sectional views for reference for describing a method of manufacturing a two-ended SPAD pixel structure according to the second exemplary embodiment of the present disclosure.

Describing the method of manufacturing the two-ended SPAD structure according to the second exemplary embodiment, first, the second impurity region 230 is formed in the bulk region 210. Referring to FIGS. 11 and 12, the second impurity region 230 may be formed by ion implantation after a mask pattern M4 having an opening through which the second impurity region 230 is to be formed is formed on the surface of the bulk region 210, for example. Afterward, referring to FIGS. 12 and 13, a mask pattern M5 having an opening through which the first impurity regions 220 are to be formed is formed on the surface of the bulk region 210, for example. Next, using the mask pattern M5, ion implantation processes are performed as many times as the number of spaced-apart first impurity regions 220 to be formed in the vertical direction in the bulk region 210. As described above, the impurity regions 220 may be formed at different depths by adjusting the ion implantation energy.

Afterward, referring to FIGS. 12 and 13, a mask pattern M6 having an opening through which the conductive region 225 is to be formed is formed on the surface of the bulk region 210, and an ion implantation process is performed again to form the conductive region 225. Next, the anode 240 and the cathode 250 are formed.

Hereinafter, single-ended SPAD structures 1' and 1" according to third and fourth exemplary embodiments of the present disclosure will be described. In describing the third and fourth embodiments, the same elements as those in the single-ended SPAD structure 1 according to the first exemplary embodiment will not be described in detail.

Figure 14:
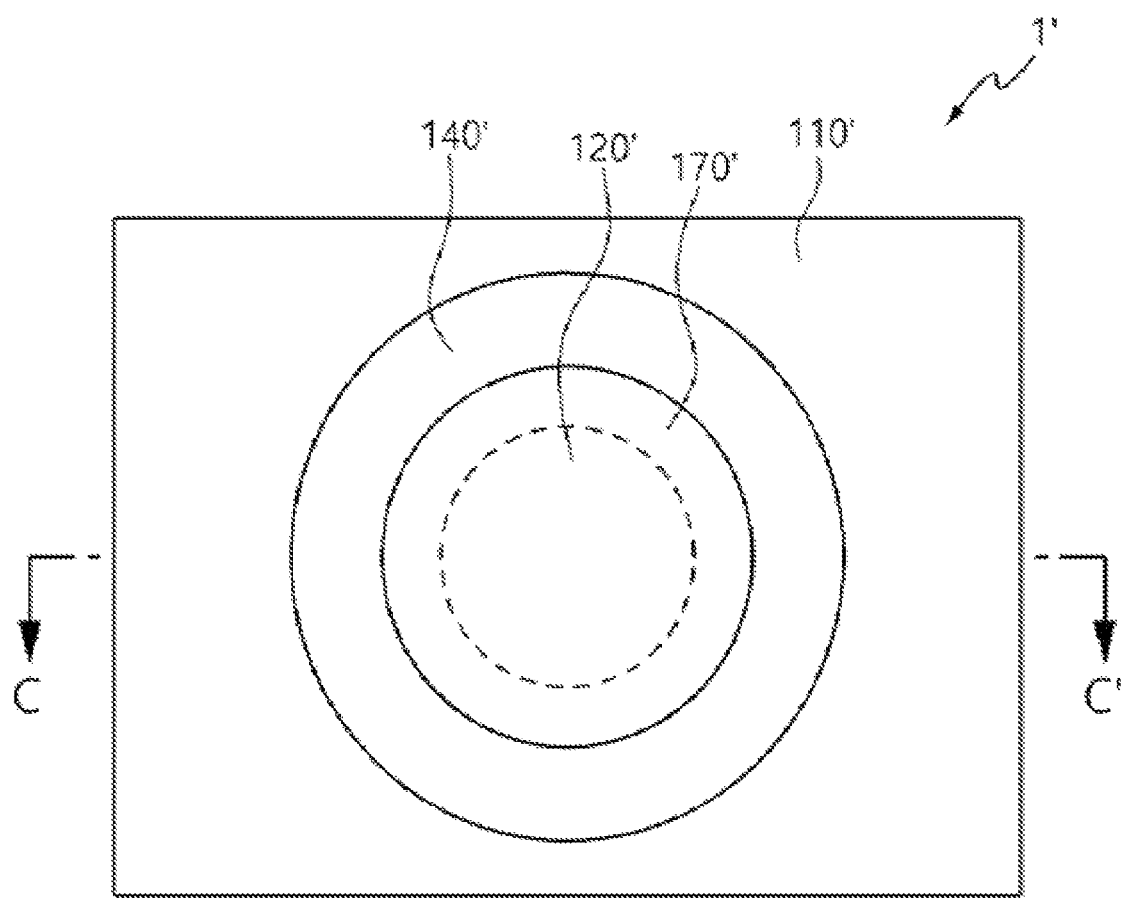
FIG. 14 is a plan view of a single-ended SPAD pixel structure according to a third exemplary embodiment of the present disclosure.
Figure 15:
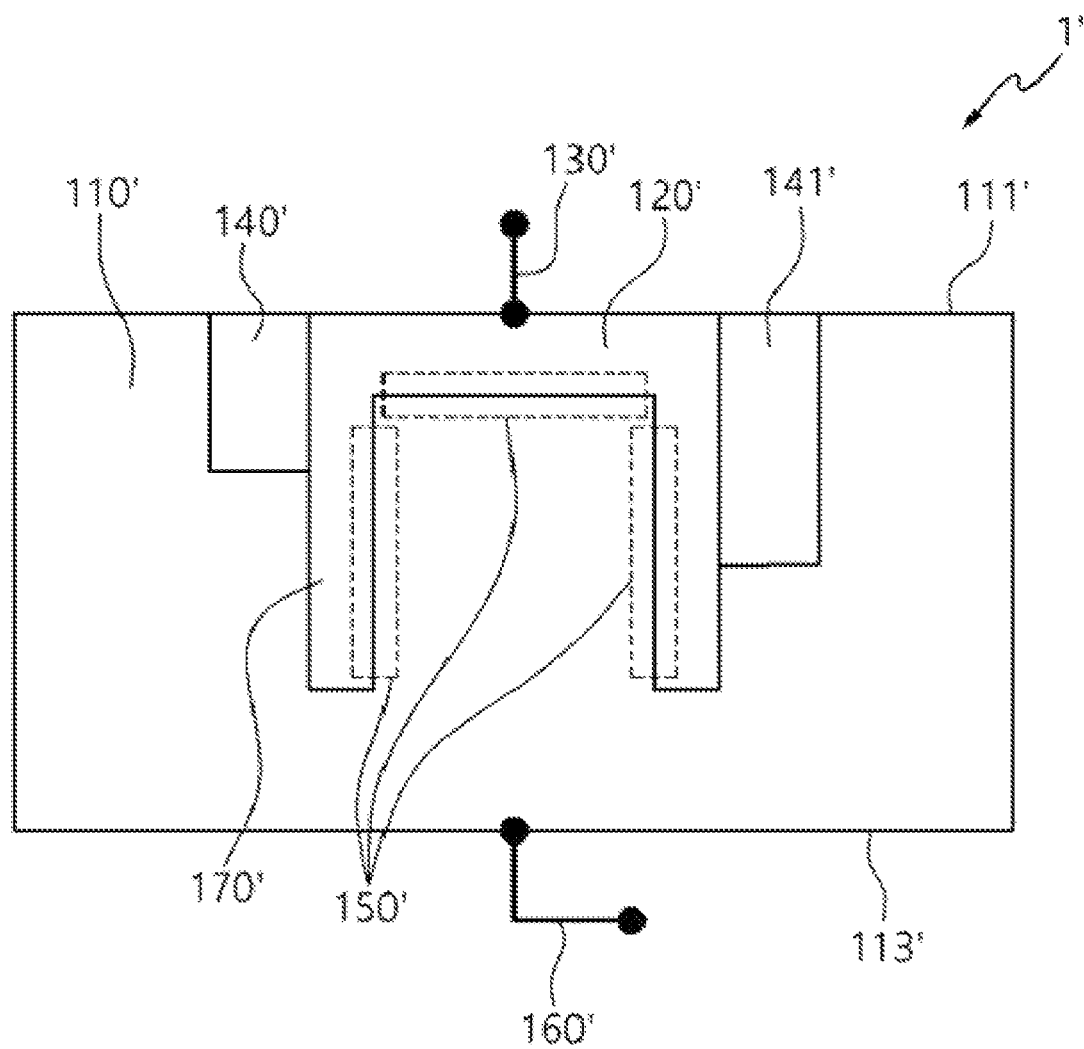
FIG. 15 is a cross-sectional view of the pixel structure of FIG. 14, taken along line C-C.

FIG. 14 is a plan view of a single-ended SPAD pixel structure according to a third exemplary embodiment of the present disclosure. FIG. 15 is a cross-sectional view of the pixel structure of FIG. 14, taken along line C-C'. FIGS. 16 to 19 are cross-sectional views for reference for describing a method of manufacturing a single-ended SPAD pixel structure according to the third exemplary embodiment.

Describing the single-ended SPAD pixel structure 1' according to the third exemplary embodiment with reference to FIGS. 14 and 15, a high-concentration impurity region 120' having a second conductivity type is in a bulk region 110'. The impurity region 120' may be on a front surface or side 111' of the bulk region 110', and may have a two-dimensional shape of a disk, for example. Unlike the structure 1 according to the first exemplary embodiment, one impurity region 120' is at the front surface 111' or uppermost side of the bulk region 110', and may be surrounded by a guard ring 140' having a first conductivity type. The guard ring 140' may have a lower concentration of second conductivity type impurities than the impurity region 120', and may be deeper than the impurity region 120' (e.g., may have a lowermost surface at a depth greater than that of the lowermost surface of the impurity region 120').

In addition, the impurity region 120' may be connected to one or more pillar regions 170'. The pillar region 170' may have substantially the same doping concentration as the impurity region 120'. In addition, the pillar region 170' may have a cylindrical or columnar structure, wherein the cylinder or column extends to a predetermined depth, and an upper portion of the cylinder or column may be connected to the impurity region 120'. For example, the pillar region 170' may have a two-dimensional ring shape, of which the inner or outer diameter or circumference is substantially the same as the outer diameter or circumference of the first impurity region 120'. Therefore, the pillar region 170' and the impurity region 120' may overlap in the vertical direction or the horizontal direction.

Figure 16:
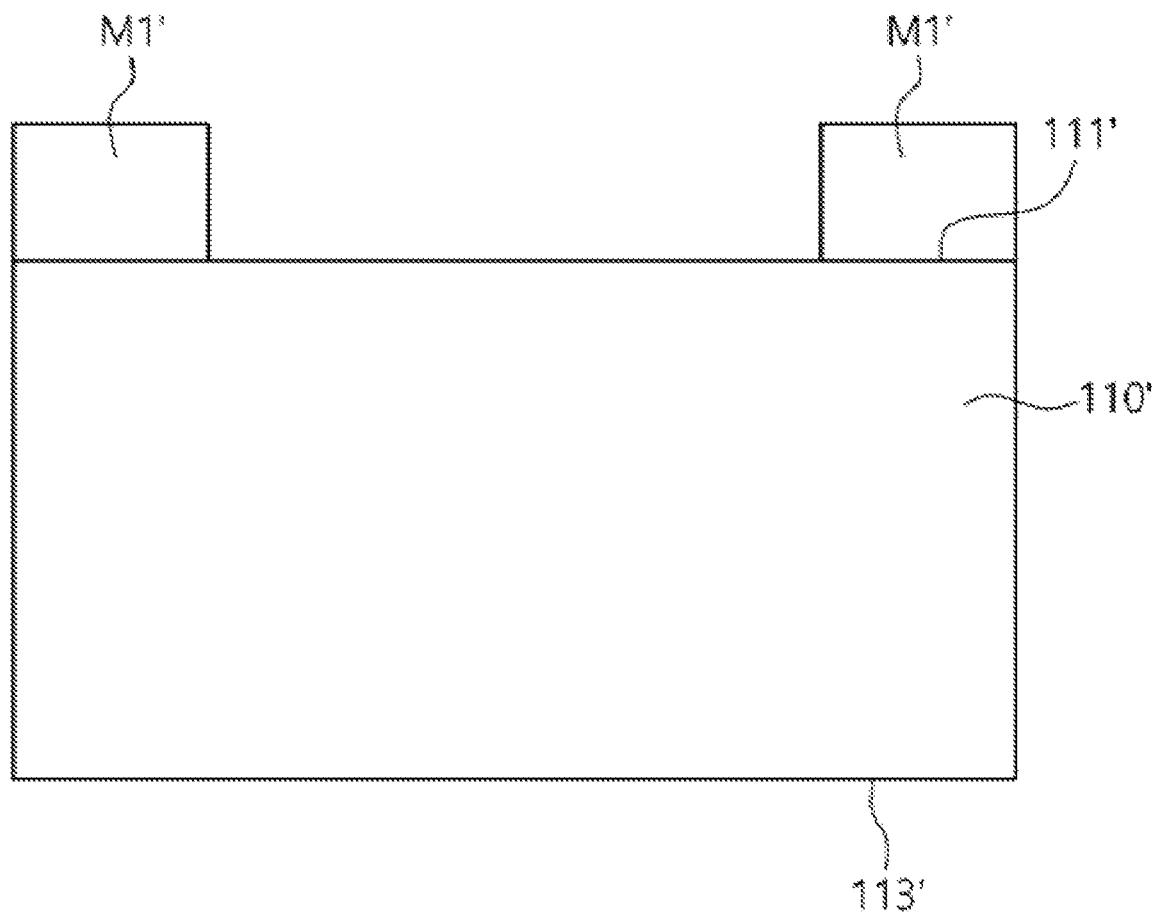
FIGS. 16 to 19 are cross-sectional views for reference for describing a method of manufacturing a single-ended SPAD pixel structure according to the third exemplary embodiment.
Figure 17:
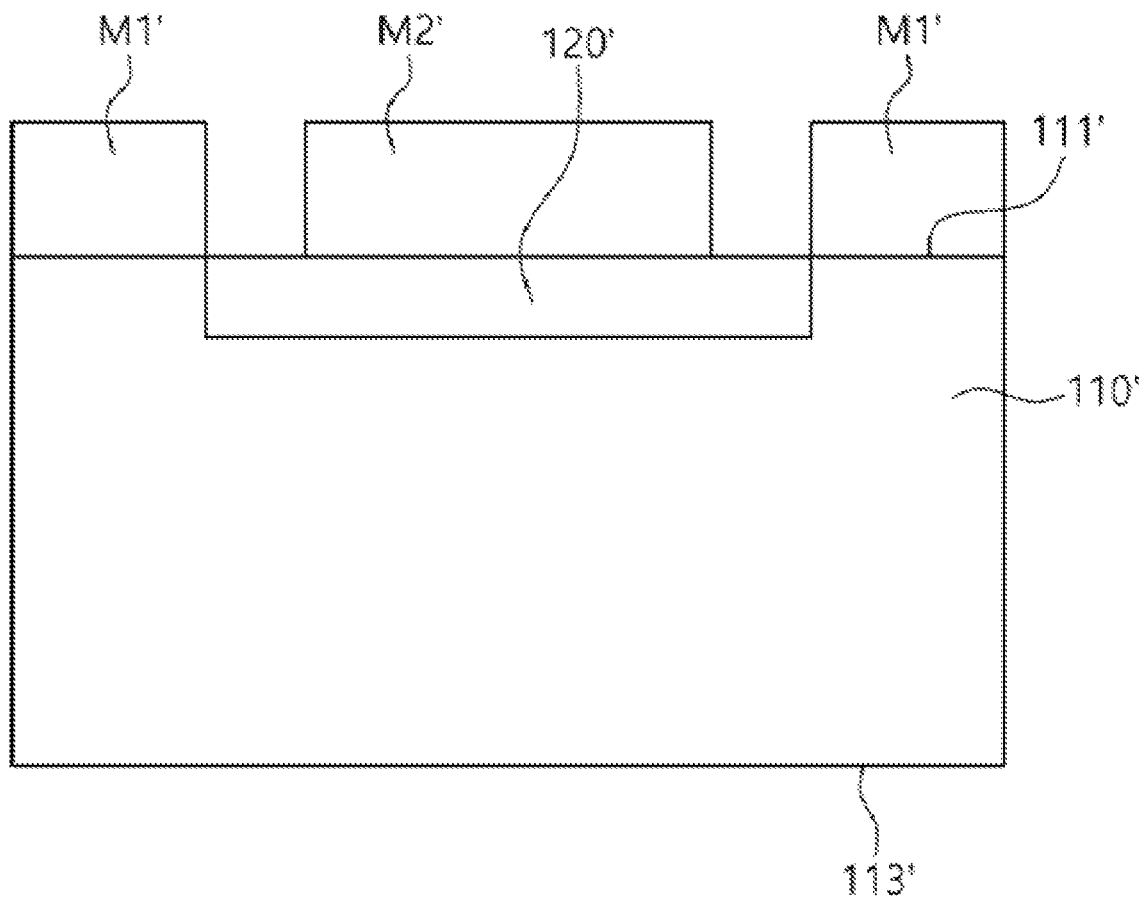
Figure 18:
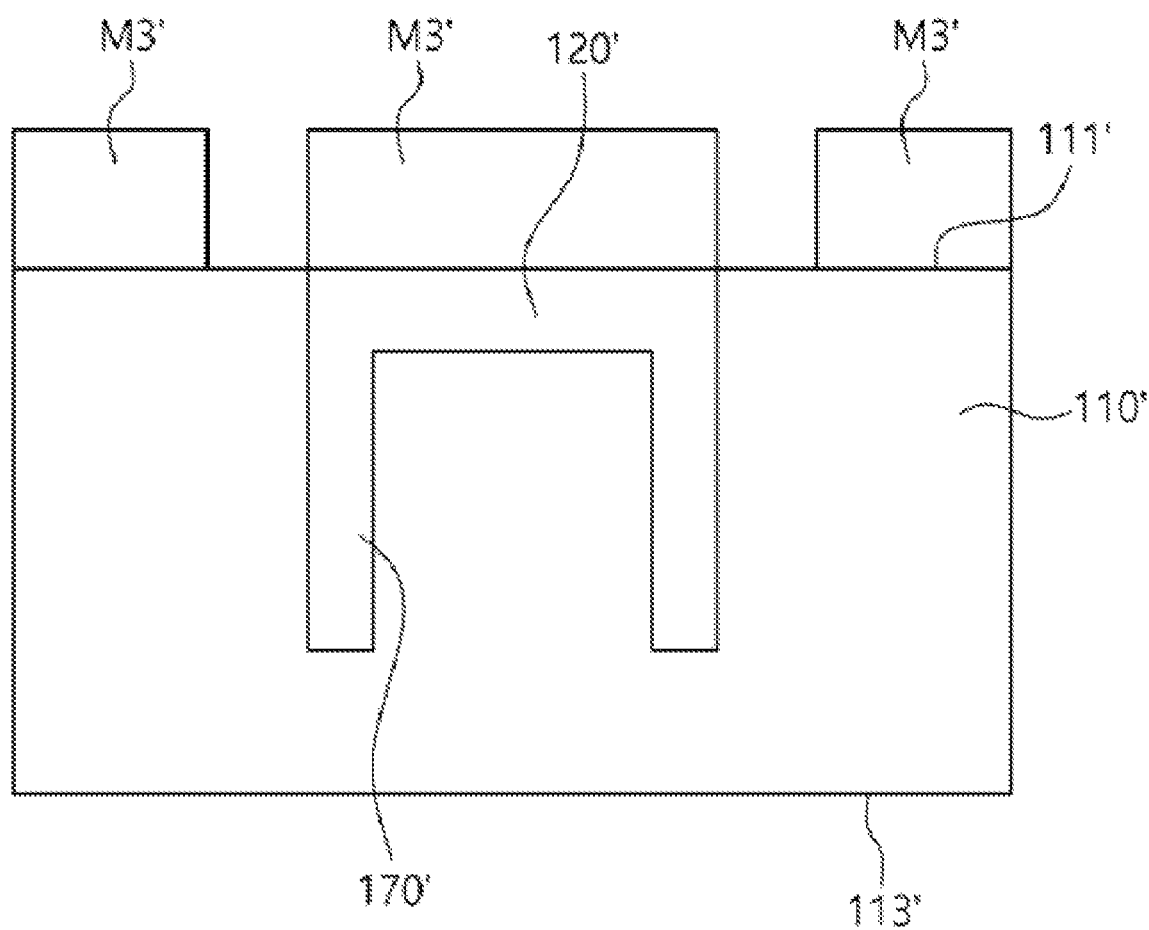
Figure 19:
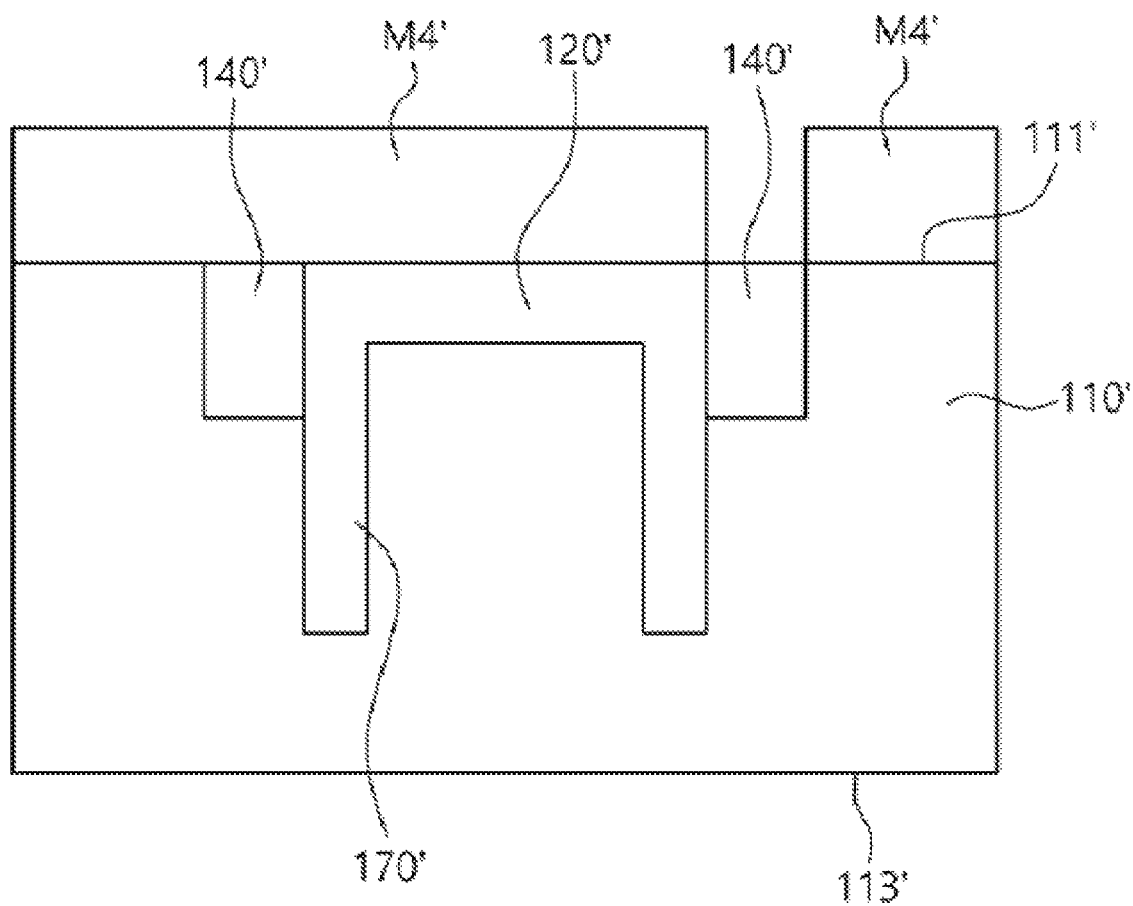

Describing the method of manufacturing the single-ended SPAD structure according to the third exemplary embodiment, first, the impurity region 120' (which may have a two-dimensional disk shape) is formed inside the bulk region 110', for example. Referring to FIGS. 16 and 17, for example, a mask pattern M1' having an opening through which the impurity region 120' is to be formed is formed on the surface of the bulk region 110'. Afterward, an ion implantation process is performed. Next, referring to FIGS. 17 and 18, with the mask pattern M1' remaining, an additional mask pattern M2' is formed in the opening in the mask pattern M1' that exposes only part of the impurity region 120', and the pillar region 170' is formed by ion implantation. The pillar region 170' may have a planar, cylindrical or two-dimensional ring shape and a cross-sectional pillar or columnar shape. It is preferable that the pillar region 170' is connected to or overlapping the impurity region 120'.

Next, the guard ring 140' is formed. For example, referring to FIGS. 18 and 19, a mask pattern M3' having an opening through which the guard ring 140' is to be formed is formed on the surface of the bulk region 110', and an ion implantation process is performed. Afterward, referring to FIG. 19, a mask pattern M4' having an opening through which the conductive region 141' is to be formed is formed on the surface of the bulk region 110', and an ion implantation process is performed again, so that the conductive region 141' is formed. It is noted that the process of forming the M4' mask pattern is not essential in the present disclosure (e.g., the third embodiment). Next, the cathode 130' and the anode 160' are formed. The anode 160' may be formed on the front surface or the rear surface of the bulk region 110', similarly to the anode 160 described above.

Figure 20:
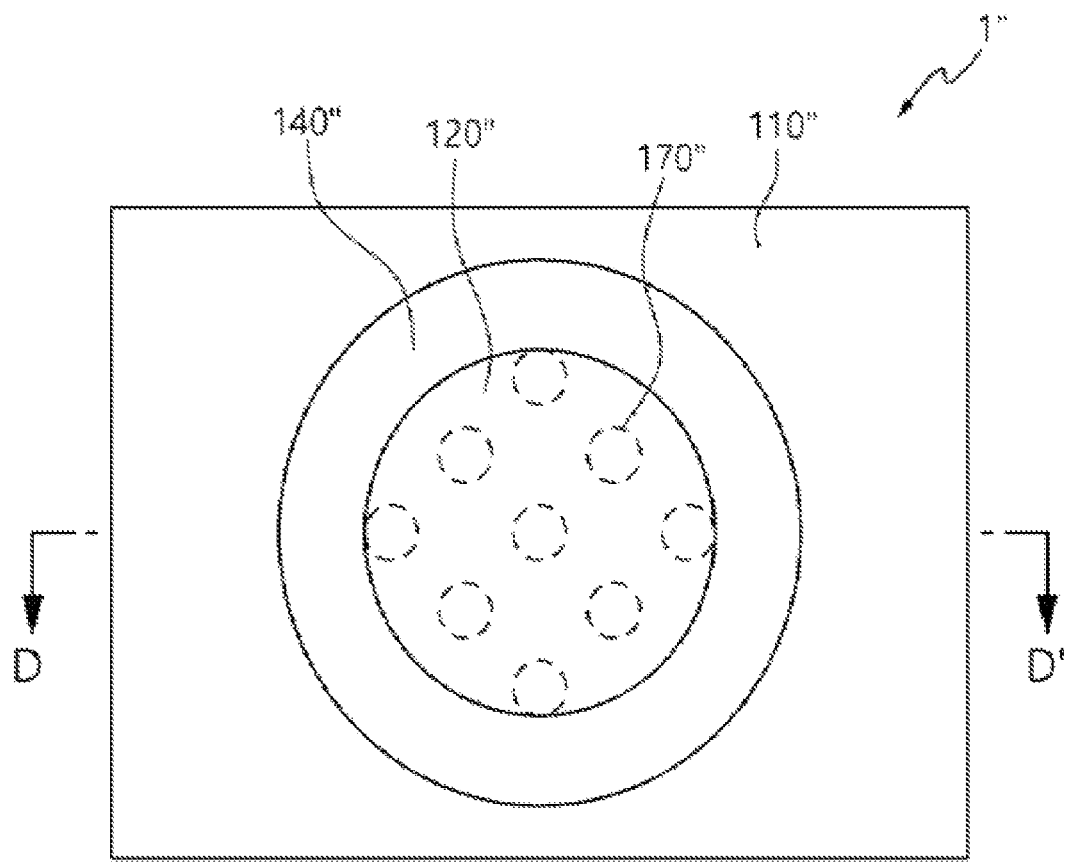
FIG. 20 is a plan view of a single-ended SPAD pixel structure according to a fourth exemplary embodiment of the present disclosure.
Figure 21:
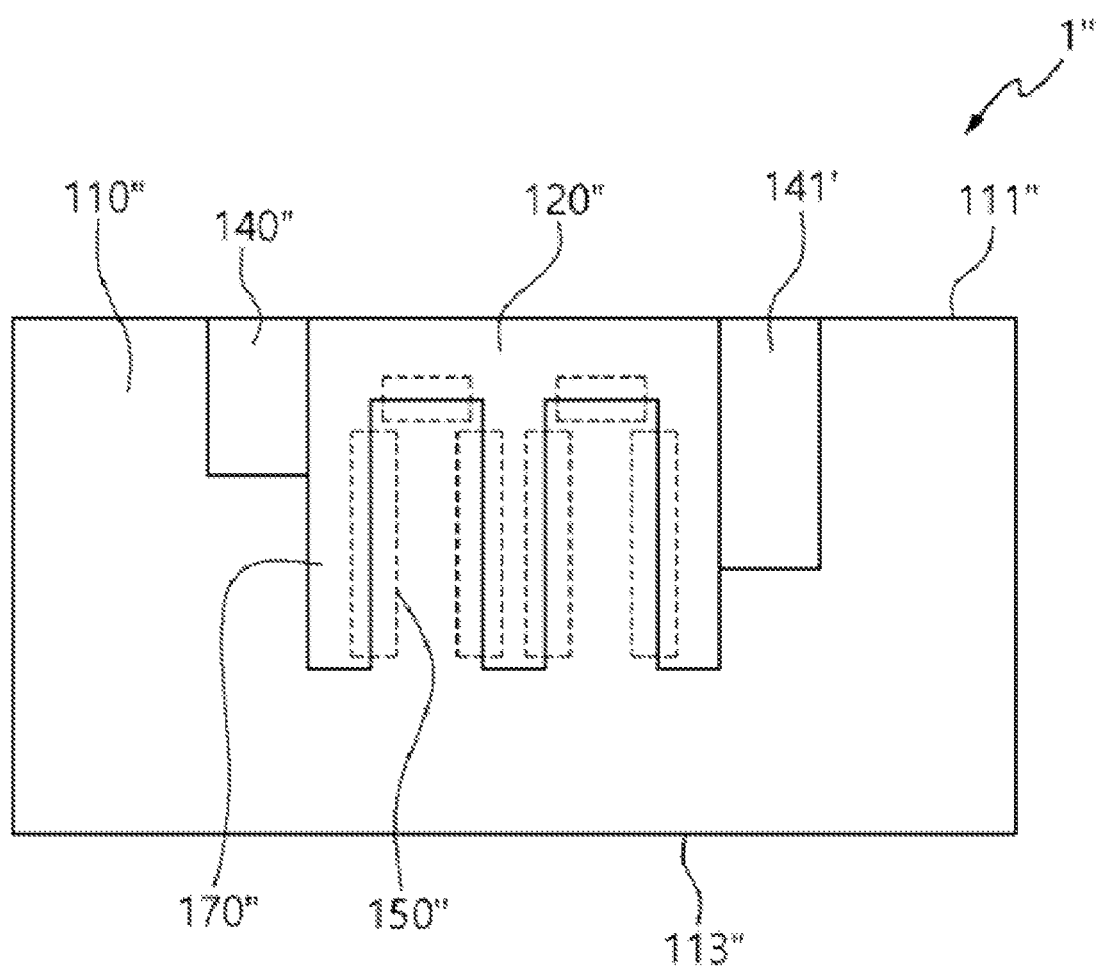
FIG. 21 is a cross-sectional view of the pixel structure of FIG. 20, taken along line D-D.
Figure 22:
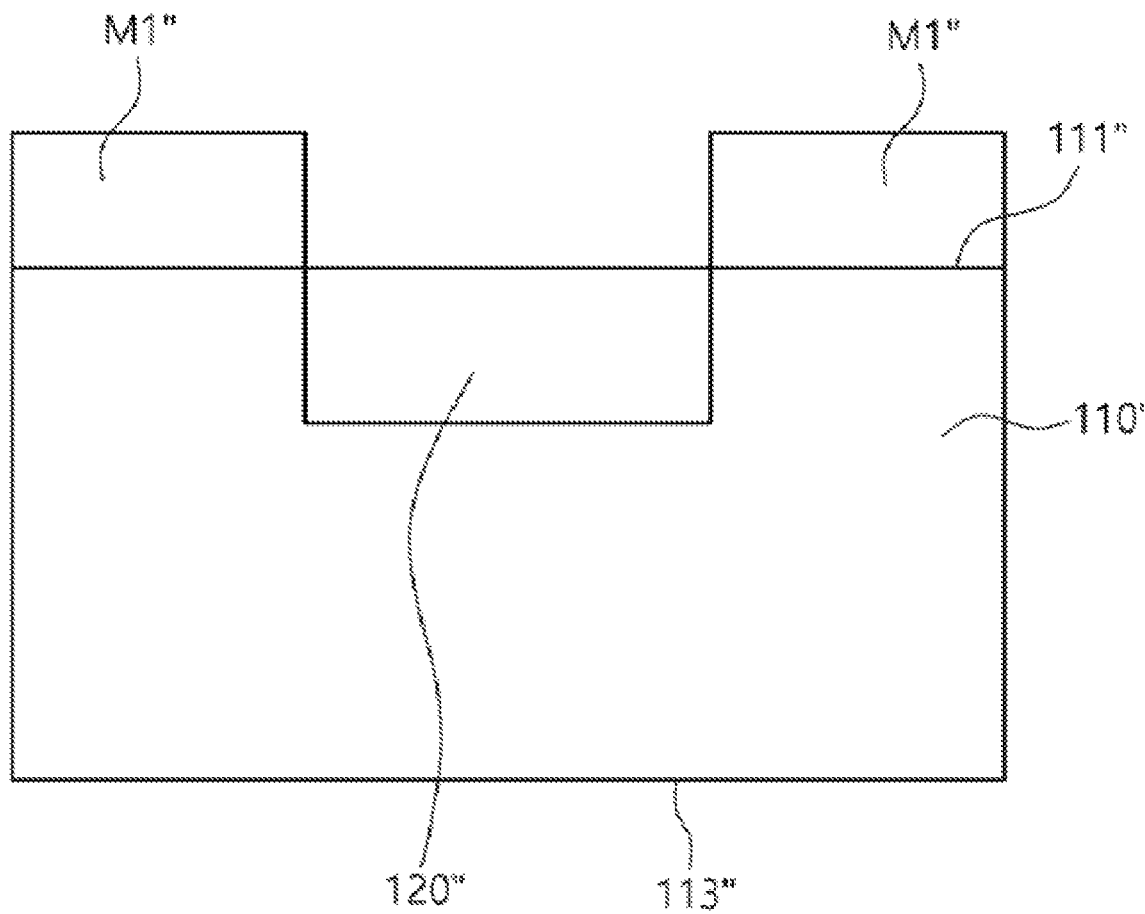
FIGS. 22 and 23 are cross-sectional views for reference for describing a method of manufacturing a single-ended SPAD pixel structure according to the fourth exemplary embodiment.
Figure 23:
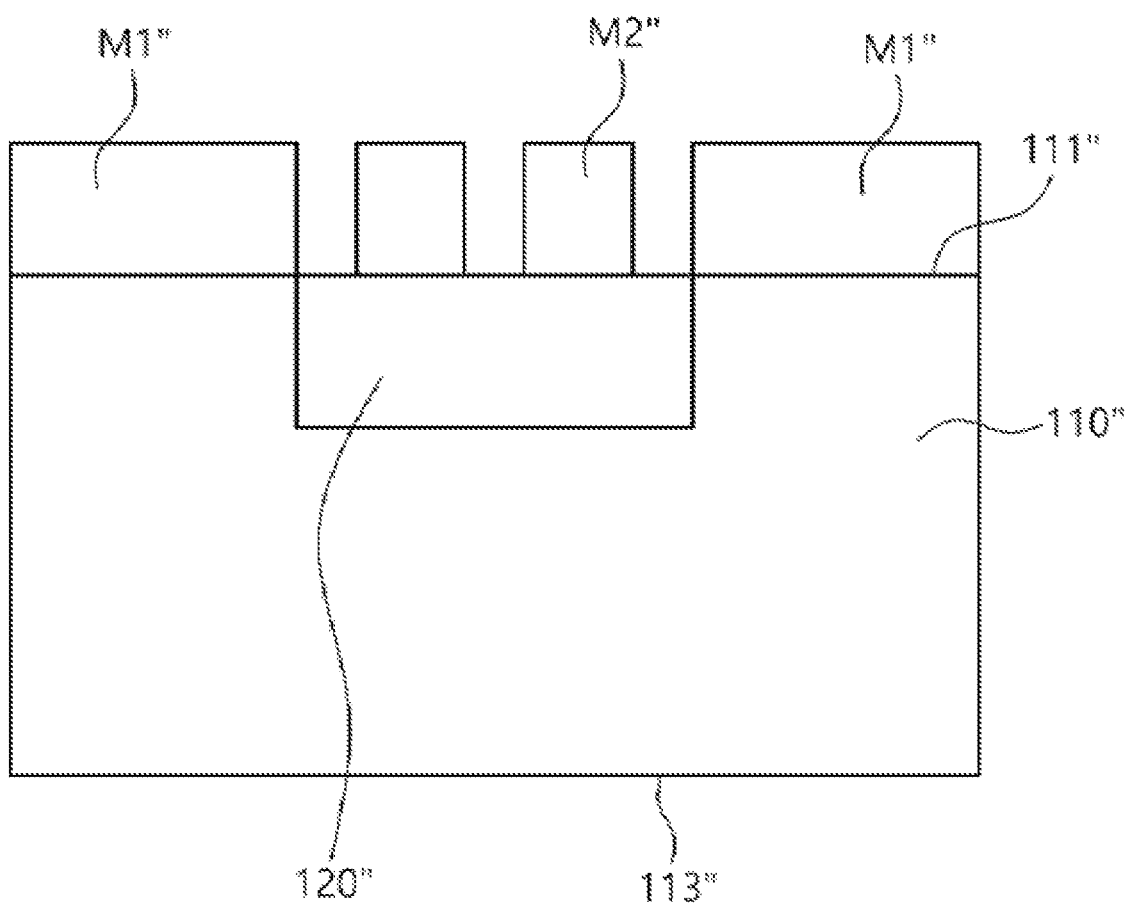

FIG. 20 is a plan view of a single-ended SPAD pixel structure according to the fourth exemplary embodiment of the present disclosure. FIG. 21 is a cross-sectional view of the pixel structure of FIG. 20, taken along line D-D'. FIGS. 22 and 23 are cross-sectional views for reference for describing a method of manufacturing a single-ended SPAD pixel structure according to the fourth exemplary embodiment.

Describing the single-ended SPAD structure 1" according to the fourth exemplary embodiment with reference to FIGS. 20 and 21, one or more (e.g., a plurality of) pillar regions 170" may have a cylindrical or columnar shape, may be separate or independent of each other, and may be below an impurity region 120". Herein, the pillar regions 170" may also be along the same horizontal axis as the impurity region 120". The multiple pillar regions 170" separate from each other may be spaced apart from each other in the horizontal direction below the impurity region 120". With such a structure, a plurality of depletion regions 150" are formed in both the horizontal and vertical directions, and the area thereof may decrease in the horizontal direction by approximately the combined areas of the uppermost surfaces of the pillar regions 170". For example, with respect to one or more horizontal axes bisecting the impurity region 120", the multiple pillar regions 170" may be along at least one such horizontal axis.

Describing the method of manufacturing the single-ended SPAD structure according to the fourth exemplary embodiment with reference to FIGS. 22 and 23, first, the impurity region 120", which may have a two-dimensional disk shape, is formed inside the bulk region 110", for example. For example, a mask pattern M1" having an opening exposing an area of the bulk region 110" in which the impurity region 120" is to be formed is formed on the surface of the bulk region 110", and an ion implantation process is performed. Next, with the mask pattern M1" remaining, the multiple pillar regions 170" independent of each other are formed using a mask pattern M2" that is an additional pattern that exposes only part of the impurity region 120". Alternatively, the mask pattern M1" may be removed before forming the mask pattern M2".

The subsequent processing is the same as in the third exemplary embodiment.

Hereinafter, two-ended SPAD structures 2' and 2" according to the fifth and sixth exemplary embodiments of the present disclosure will be described. In describing the fifth and sixth exemplary embodiments, the same elements as those of the two-ended SPAD 2 according to the second exemplary embodiment will not be described in detail.

Figure 24:
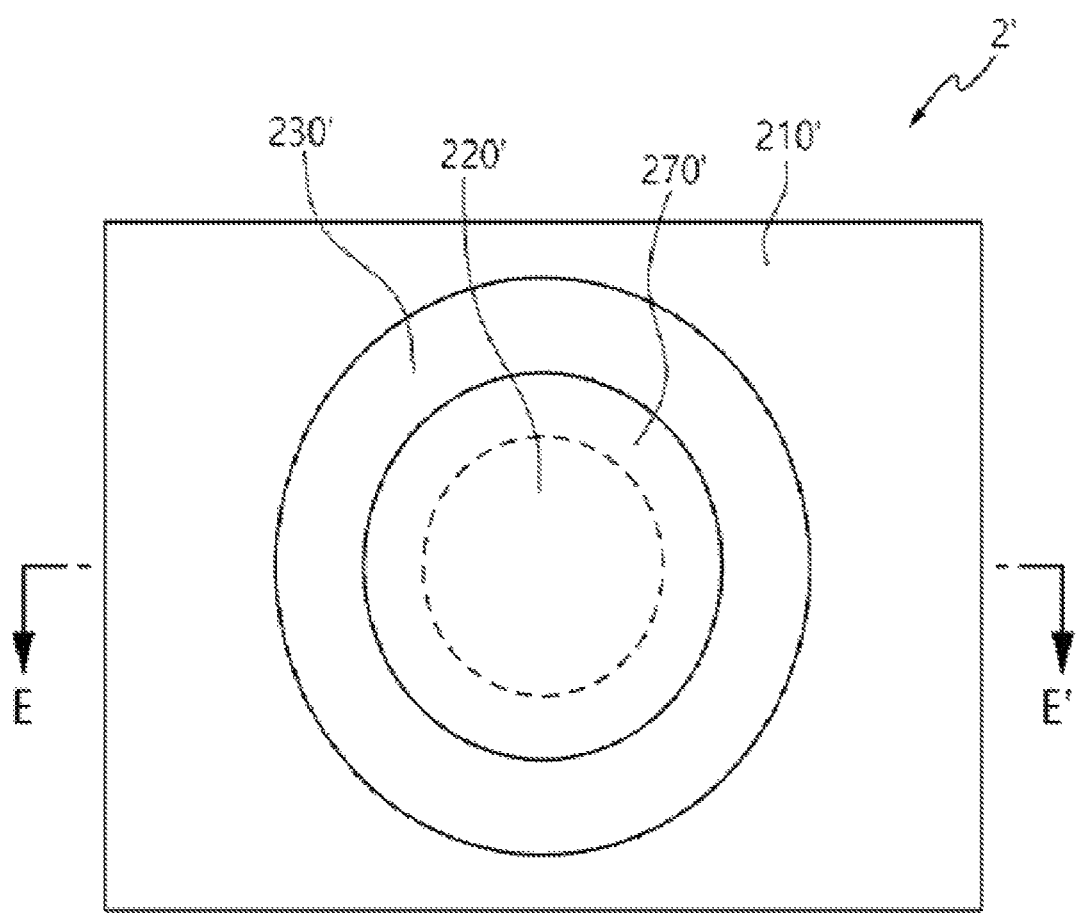
FIG. 24 is a plan view of a two-ended SPAD pixel structure according to a fifth exemplary embodiment of the present disclosure.
Figure 25:
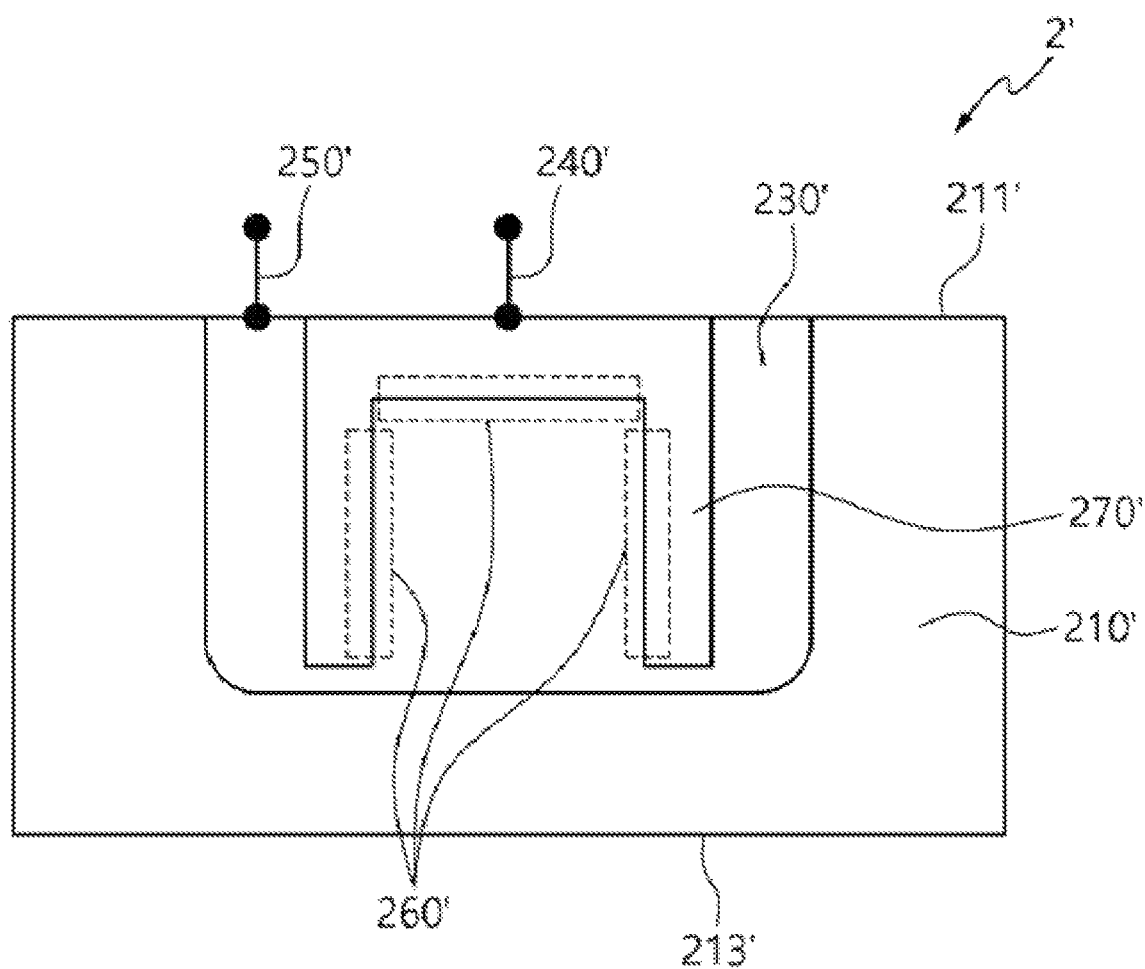
FIG. 25 is a cross-sectional view of the pixel structure of FIG. 24, taken along line E-E.
Figure 26:
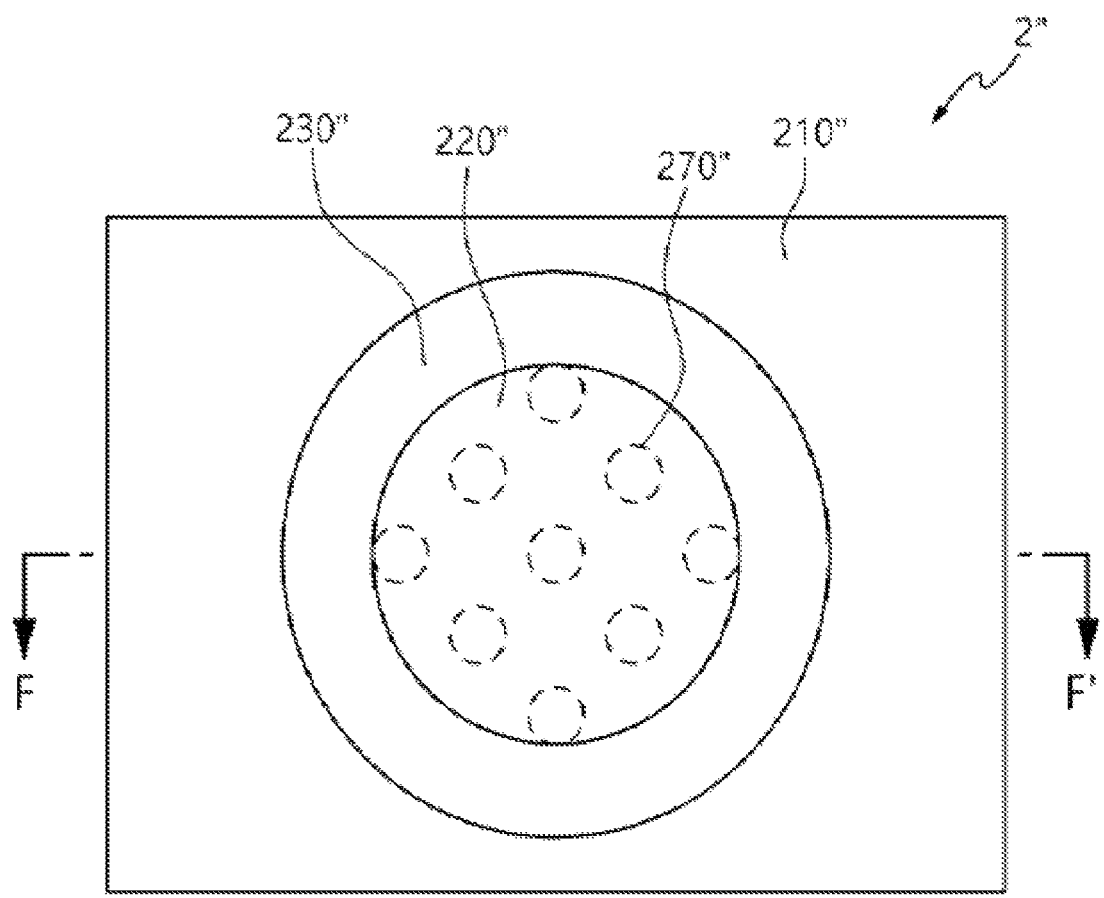
FIG. 26 is a plan view of a two-ended SPAD pixel structure according to a sixth exemplary embodiment of the present disclosure.
Figure 27:
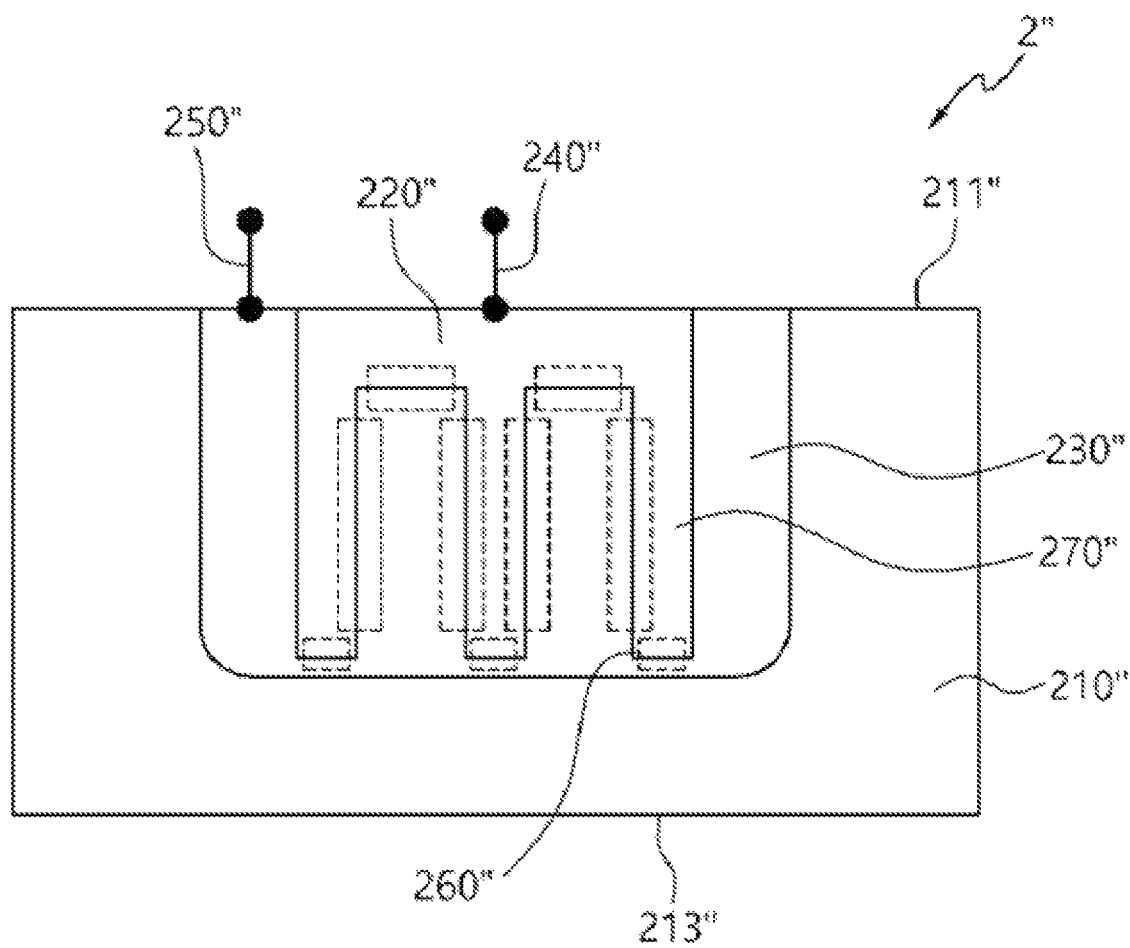
FIG. 27 is a cross-sectional view of the pixel structure of FIG. 26, taken along line F-F'.

FIG. 24 is a plan view of a two-ended SPAD pixel structure according to the fifth exemplary embodiment of the present disclosure. FIG. 25 is a cross-sectional view of the pixel structure of FIG. 24, taken along line E-E'. FIG. 26 is a plan view of a two-ended SPAD pixel structure according to the sixth exemplary embodiment of the present disclosure. FIG. 27 is a cross-sectional view of the pixel structure of FIG. 26, taken along line F-F'.

Describing the two-ended SPAD structures 2' and 2" according to the fifth and sixth exemplary embodiments with reference to FIGS. 24 to 27, first impurity regions 220' and 220" are in second impurity regions 230' and 230", which are, in turn, in the bulk regions 210' and 210", respectively. The first impurity regions 220' and 220" have a high concentration of first conductivity type impurities, and the second impurity regions 230' and 230" have a second conductivity type. In addition, the first impurity regions 220' and 220" are respectively connected to pillar regions 270' and 270". The pillar regions 270' and 270" respectively have the same or substantially the same shapes as the pillar regions 170' and 170" in the single-ended SPAD structures 1' and 1" according to the third and fourth exemplary embodiments, and thus will not be described in detail.

In addition, methods of manufacturing the two-ended SPAD structures 2' and 2" are also substantially the same as the methods of manufacturing the single-ended SPAD structures 1' and 1" according to the third and fourth exemplary embodiments, except for forming the second impurity regions 230' and 230". The second impurity regions 230' and 230" are formed by an ion implantation process, the first impurity regions 220' and 220" are formed (e.g., in the second impurity regions 230' and 230", respectively), and the pillar regions 270' and 270" are then formed in substantially the same manner as the pillar regions 170' and 170", respectively.

The foregoing detailed description illustrates the present disclosure. In addition, the foregoing illustrates and describes various embodiments of the present disclosure and the present disclosure may be utilized in various other combinations, modifications, and environments. That is, it is possible to make changes or modifications within the scope of the disclosure herein, within the scope of equivalents to the above described disclosure, and/or within the scope of the skill or knowledge in the art. The above-described embodiments are intended to describe various ways for carrying out the technical spirit of the present disclosure, and various modifications for specific applications and/or uses of the present disclosure are possible. Accordingly, the foregoing detailed description is not intended to limit the present disclosure to the embodiments disclosed.

What is claimed is:

1. A SPAD pixel structure, comprising:
a bulk region having a first conductivity type;
heavily doped impurity regions spaced apart in a vertical direction in the bulk region, the impurity regions having a second conductivity type;
a lightly doped guard ring deeper than an uppermost one of the impurity regions, the guard ring surrounding the impurity regions and having the second conductivity type;
a cathode on the uppermost one of the impurity regions;
an anode at the bulk region, and
multiple PN junctions between the bulk region and the impurity regions, spaced apart in the vertical direction.

2. The SPAD pixel structure of claim 1, wherein the guard ring comprises a conductive region connecting the impurity regions.

3. The SPAD pixel structure of claim 2, wherein the conductive region is only in a part of the guard ring, and extends from the uppermost one of the impurity regions to a position that is in contact with a lowermost one of the impurity regions.

4. A SPAD pixel structure, comprising:
a bulk region having a first conductivity type;
heavily doped first impurity regions spaced apart in a vertical direction in a second impurity region, the first impurity regions having the first conductivity type, and the second impurity region having a second conductivity type and surrounding the first impurity regions;
a cathode at a surface of the second impurity region; and
an anode at a surface of an uppermost one of the first impurity regions, wherein the first impurity regions comprise a conductive region that connects the first impurity regions to each other and extends in the vertical direction in the second impurity region, and multiple PN junctions between the second impurity region and the first impurity regions are spaced apart in the vertical direction.

5. The SPAD pixel structure of claim 4, wherein the first impurity regions are formed by ion implantation using the same mask pattern.

6. The SPAD pixel structure of claim 4, wherein each of the first impurity regions has a disk shape.

7. A SPAD pixel structure, comprising:
a bulk region having a first conductivity type, a front surface and a rear surface;
a heavily doped impurity region at a surface of the bulk region and/or in the bulk region, the impurity region having a second conductivity type;
a heavily doped pillar region connected to the impurity region and extending to a predetermined depth, the pillar region having the second conductivity type;
a cathode on the impurity region; and
an anode at the bulk region,
wherein a PN junction between the pillar region and the bulk region is substantially vertical.

8. The SPAD pixel structure of claim 7, wherein the pillar region has a substantially planar and/or ring shape.

9. The SPAD pixel structure of claim 7, wherein the pillar region extends from one side and/or a lower portion of the impurity region.

10. The SPAD pixel structure of claim 7, further comprising:
a lightly doped guard ring having the second conductivity type surrounding an outer circumferential surface of the impurity region,
wherein the guard ring has a lowermost surface above a lowermost surface of the pillar region.

11. The SPAD pixel structure of claim 7, comprising a plurality of the pillar regions, each connected to the impurity region, and spaced apart in a horizontal direction.

12. The SPAD pixel structure of claim 11, wherein the plurality of the pillar regions completely overlap with the impurity region.

13. The SPAD pixel structure of claim 11, wherein the impurity region has a two-dimensional disk shape.

14. The SPAD pixel structure of claim 13, wherein the plurality of the pillar regions are along at least one horizontal axis bisecting the impurity region.

15. A SPAD pixel structure, comprising:
a bulk region having a first conductivity type;
a heavily doped first impurity region at a surface of a second impurity region and/or in the second impurity region, the first impurity region having the first conductivity type, and the second impurity region having a second conductivity type and surrounding the first impurity region; and
a pillar region connected to the first impurity region and extending into the second impurity region.

16. The SPAD pixel structure of claim 15, wherein the pillar region has a ring shape with a predetermined height.

17. The SPAD pixel structure of claim 15, comprising a plurality of the pillar regions, spaced apart from each other in a horizontal direction, and connected to each other via the first impurity region.

18. The SPAD pixel structure of claim 17, wherein the plurality of the pillar regions have lowermost surfaces at substantially a same height.

* * * * *